US011923463B2

(12) United States Patent
Zhang et al.

(10) Patent No.: US 11,923,463 B2
(45) Date of Patent: Mar. 5, 2024

(54) POWER SCHOTTKY BARRIER DIODES WITH HIGH BREAKDOWN VOLTAGE AND LOW LEAKAGE CURRENT

(71) Applicants: Yuhao Zhang, Blacksburg, VA (US); Ming Xiao, Blacksburg, VA (US)

(72) Inventors: Yuhao Zhang, Blacksburg, VA (US); Ming Xiao, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 261 days.

(21) Appl. No.: 17/244,394

(22) Filed: Apr. 29, 2021

(65) Prior Publication Data

US 2022/0352390 A1 Nov. 3, 2022

(51) Int. Cl.
H01L 29/872 (2006.01)
H01L 29/06 (2006.01)
H01L 29/20 (2006.01)
H01L 29/205 (2006.01)
H01L 29/417 (2006.01)
H01L 29/66 (2006.01)

(52) U.S. Cl.
CPC ........ H01L 29/872 (2013.01); H01L 29/0688 (2013.01); H01L 29/2003 (2013.01); H01L 29/205 (2013.01); H01L 29/417 (2013.01); H01L 29/66212 (2013.01)

(58) Field of Classification Search
None
See application file for complete search history.

(56) References Cited

U.S. PATENT DOCUMENTS

| 8,933,531 | B2 | 1/2015 | Jeon et al. |
| 9,105,757 | B2 | 8/2015 | Huang et al. |
| 9,293,538 | B2 | 3/2016 | Palacios et al. |
| 10,062,766 | B1 | 8/2018 | Tsai et al. |
| 2010/0140660 | A1 | 6/2010 | Wu et al. |

(Continued)

FOREIGN PATENT DOCUMENTS

CN 112119505 A * 12/2020 ......... H01L 21/8252

OTHER PUBLICATIONS

English translation of CN-112119505-A (Year: 2020).*

(Continued)

Primary Examiner — Khaja Ahmad
(74) Attorney, Agent, or Firm — Johnson, Marcou, Isaacs & Nix LLC; John S. Sears

(57) ABSTRACT

This disclosure provides a diode including a semiconductor region having at least one two-dimensional carrier channel of a first conductivity type. The diode also includes a plurality of sidewalls exposed in the semiconductor region defining at least one trench extending through the at least one two-dimensional carrier channel and a material of a second conductivity type, the second conductivity type being the other of the n-type and the p-type conductivity, disposed on the plurality of sidewalls and in contact with the at least one two-dimensional carrier channel. The diode also includes an anode material in contact with at least a portion of the semiconductor region and in contact with at least a portion of the material of the second conductivity type, and a cathode material in contact with the at least one two-dimensional carrier channel.

20 Claims, 22 Drawing Sheets

(56) References Cited

U.S. PATENT DOCUMENTS

| | | | | |
|---|---|---|---|---|
| 2013/0134443 | A1* | 5/2013 | Terano | H01L 29/205 257/77 |
| 2014/0054603 | A1* | 2/2014 | Wu | H01L 27/0629 257/195 |
| 2015/0295072 | A1* | 10/2015 | Rezanezhad Gatabi | H01L 29/423 257/29 |
| 2018/0248009 | A1 | 8/2018 | Wong et al. | |
| 2019/0229208 | A1 | 7/2019 | Matioli et al. | |
| 2019/0267454 | A1* | 8/2019 | Matioli | H01L 29/2003 |
| 2022/0052207 | A1* | 2/2022 | Zhang | H01L 29/7786 |

OTHER PUBLICATIONS

Huang, "Power Semiconductor Devices for Smart Grid and Renewable Energy Systems," IEEE 105:11 (2017), 2019-2047.

Millan, et al., "High-Voltage SiC Devices: Diodes and MOSFETs," IEEE (2015), 11-18.

Amano, et al., "The 2018 GaN power electronics roadmap," J Phys D: Appl Phys 51 (2018), 1-48.

Ohta, et al., "Two-Step Mesa Structure GaN p-n Diodes With Low On-Resistance, High Breakdown Voltage, and Excellent Avalanche Capabilities," IEEE Electron Device Letters 41:1 (2020), 123-126.

Colon, et al., "Demonstration of a 9 kV reverse breakdown and 59 mΩ-cm2 specific on-resistance AlGaN/GaN Schottky barrier diode," Solid State Electronics 151 (2019), 47-51.

Ishida, et al., "GaN-based Natural Super Junction Diodes with Multi-channel Structures," IEEE International Electron Devices Meeting (2008), 1-4.

Zhang, et al., "Lateral $Al_xGa_{1-x}N$ power rectifiers with 9.7 kV reverse breakdown voltage," Appl Phys Lett 78 (2001), 823-825.

Xiao, et al., "3.3 kV Multi-Channel AlGaN/GaN Schottky Barrier Diodes with P-GaN Termination," IEEE Electron Device Letters 41:8 (2020), 1177-1180.

Ma, et al., "1200 V Multi-Channel Power Devices with 2.8 Ωmm ON-Resistance," IEEE International Electron Devices Meeting (IEDM) (2019), 4.1.1-4.1.4.

Ma, et al., "Multi-Channel Tri-Gate GaN Power Schottky Diodes with Low ON-Resistance," IEEE Electron Device Letters 40:2 (2019), 275-278.

Wang, et al., "High-voltage vertical $Ga_2O_3$ power rectifiers operational at high temperatures up to 600 K," Appl Phys Lett 115 (2019), 263503-1-263503-5.

Zhang, et al., "Gallium nitride vertical power devices on foreign substrates: a review and outlook," J Phys D: Appl Phys 51 (2018), 1-13.

Ghandi, et al., "3kV SiC Charge-Balanced Diodes Breaking Unipolar Limit," Proceedings of the 31st International Symposium on Power Semiconductor Devices & ICs, Shanghai, China (2019), 179-182.

Schoeck, et al., "4.5 kV SiC Junction Barrier Schottky Diodes with Low Leakage Current and High Forward Current Density," Materials Science Forum 897 (2017), 427-430.

Eblaba, et al., "Multi-channel AlGaN/GaN Lateral Schottky Barrier Diodes on Low Resistivity Silicon for Sub-ThZ Integrated Circuits Applications," IEEE Electron Device Letters 40(6), 878-880.

Ma, et al., "Multi-channel tri-gate normally-on/off AlGaN/GaN MOSHEMTs on Si substrate with high breakdown voltage and low ON-resistance," Applied Physics Letters 113 (2018), 242102-1-242102-5.

\* cited by examiner

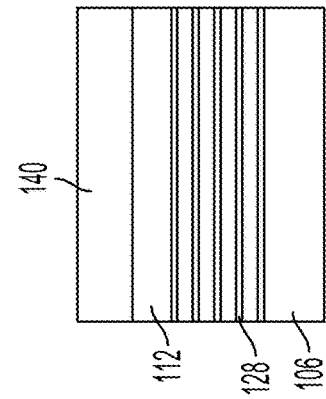
FIG. 2A
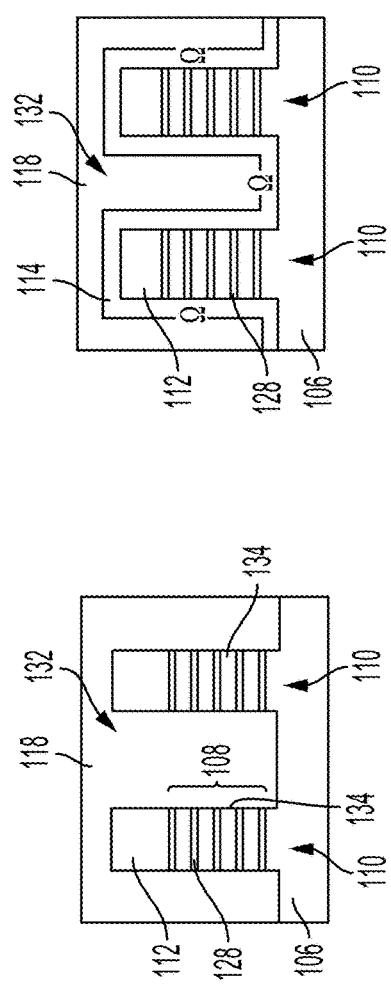
FIG. 2B
FIG. 2C
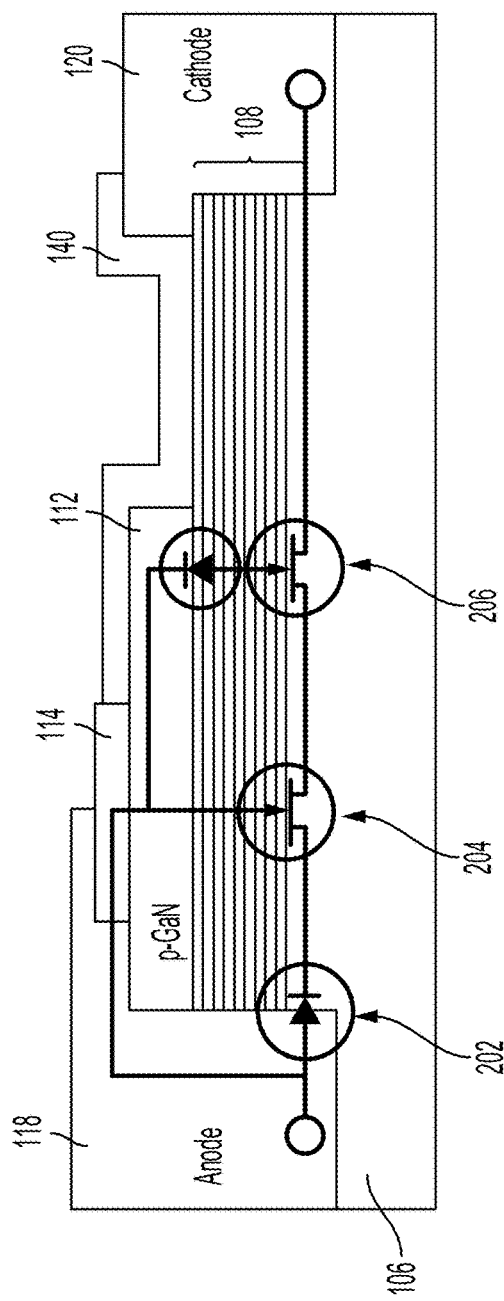
FIG. 2D

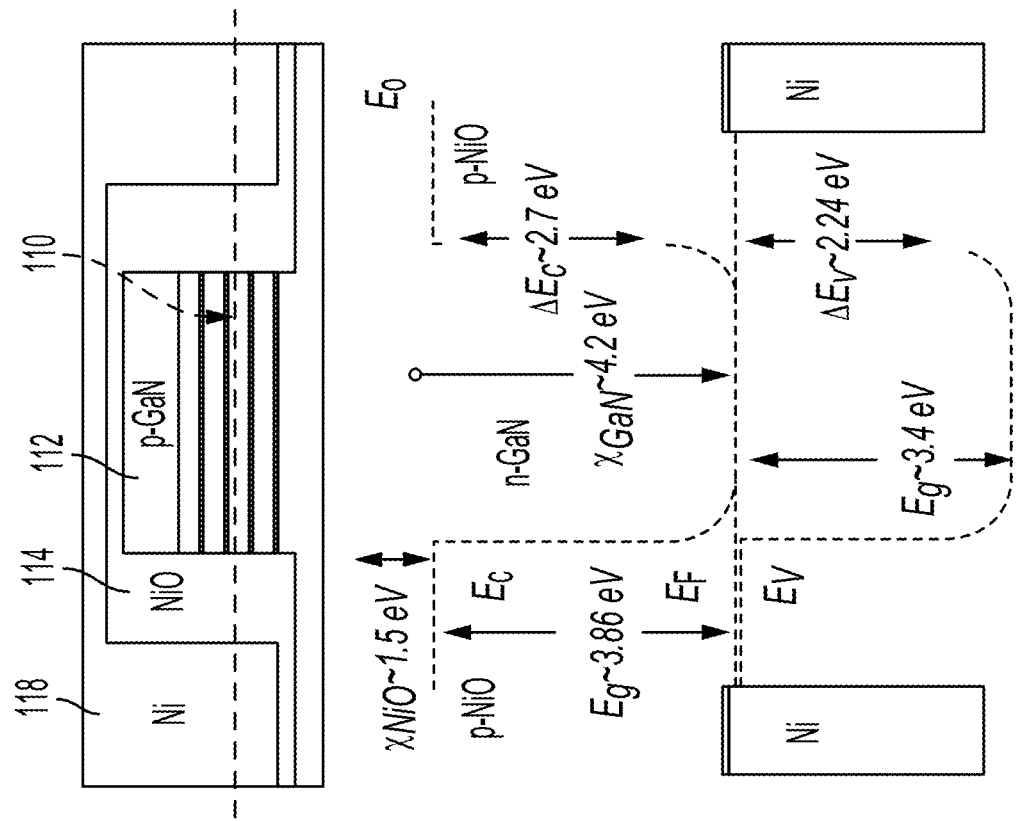
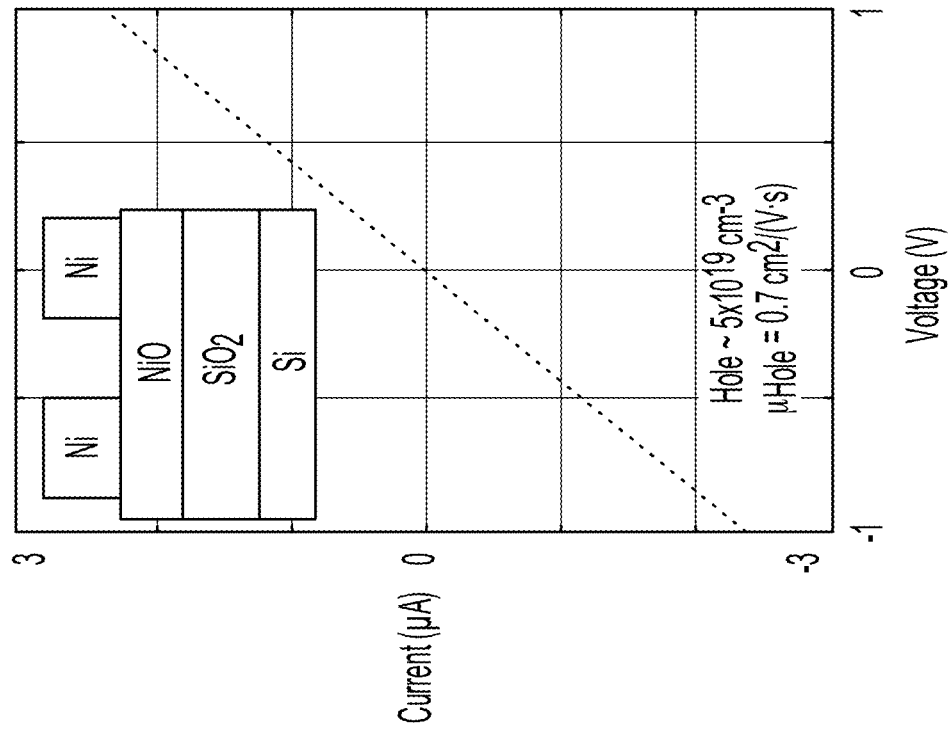
FIG. 3

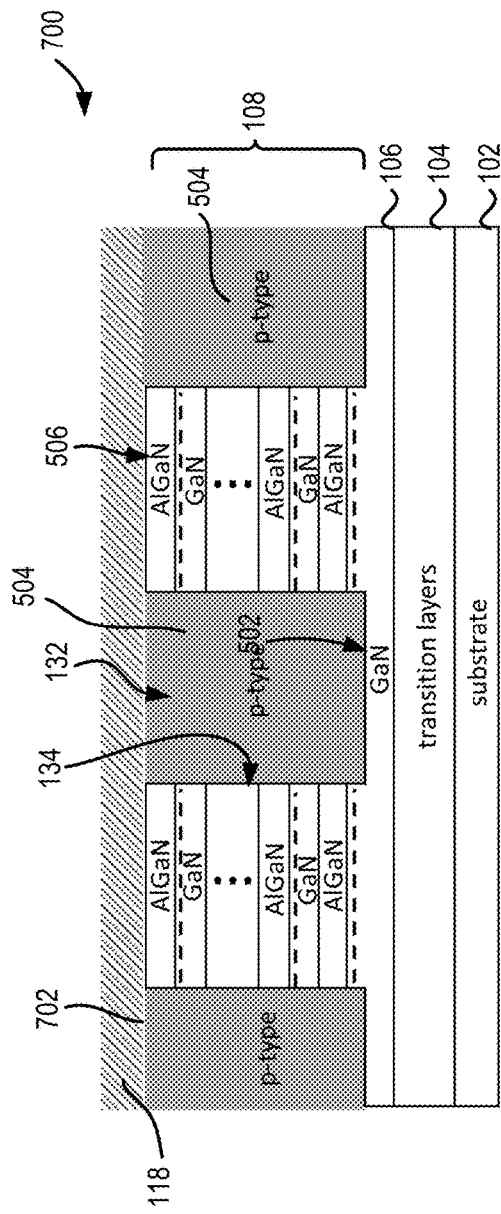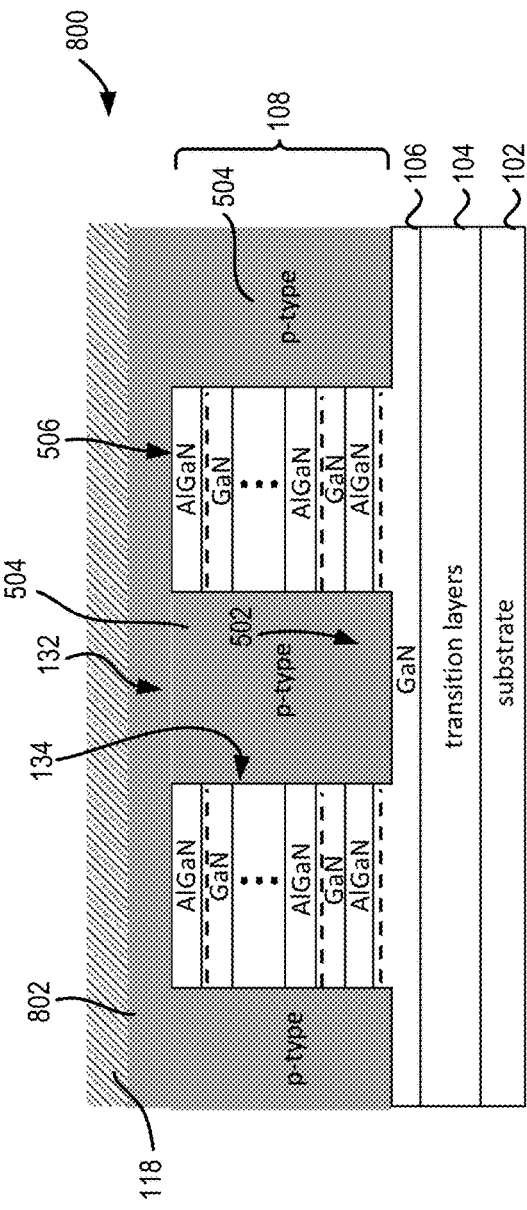

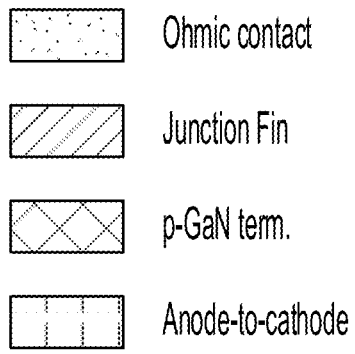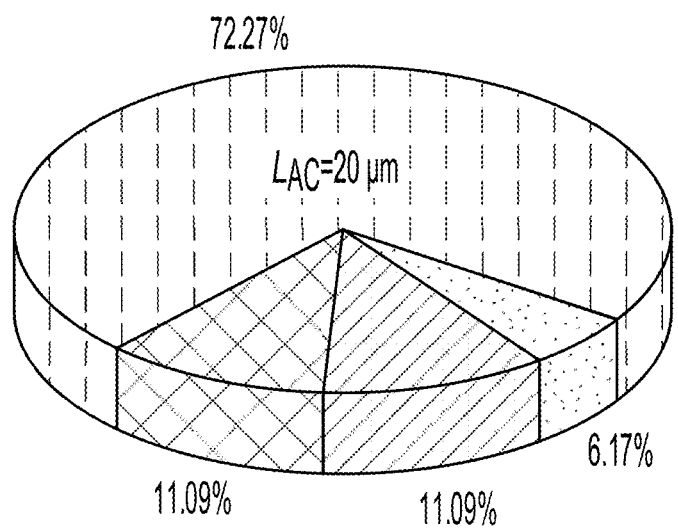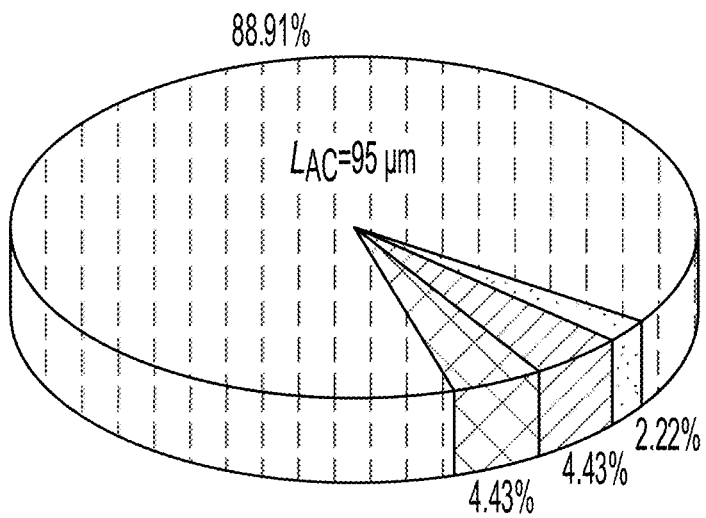
FIG. 17

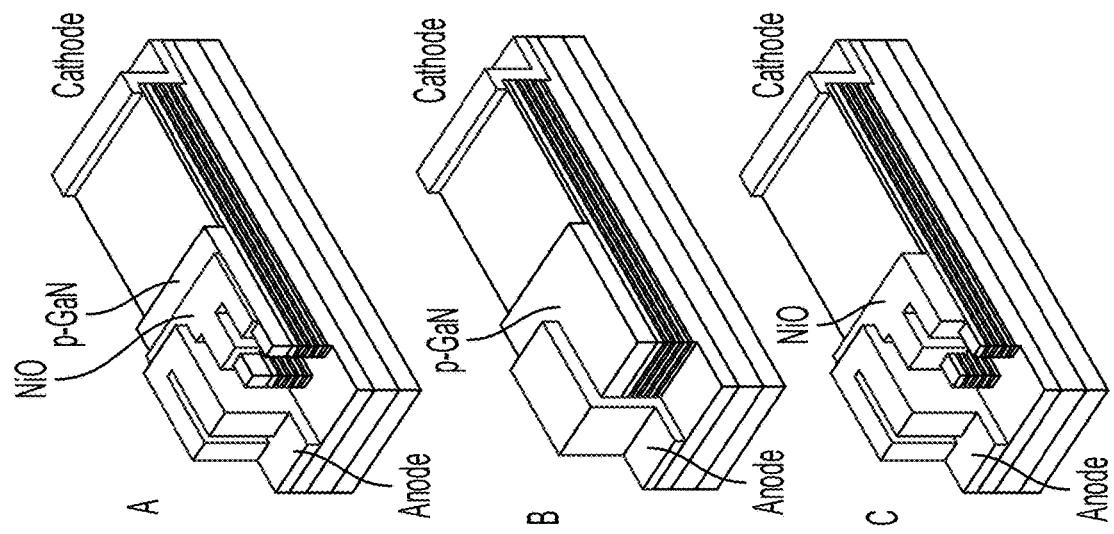
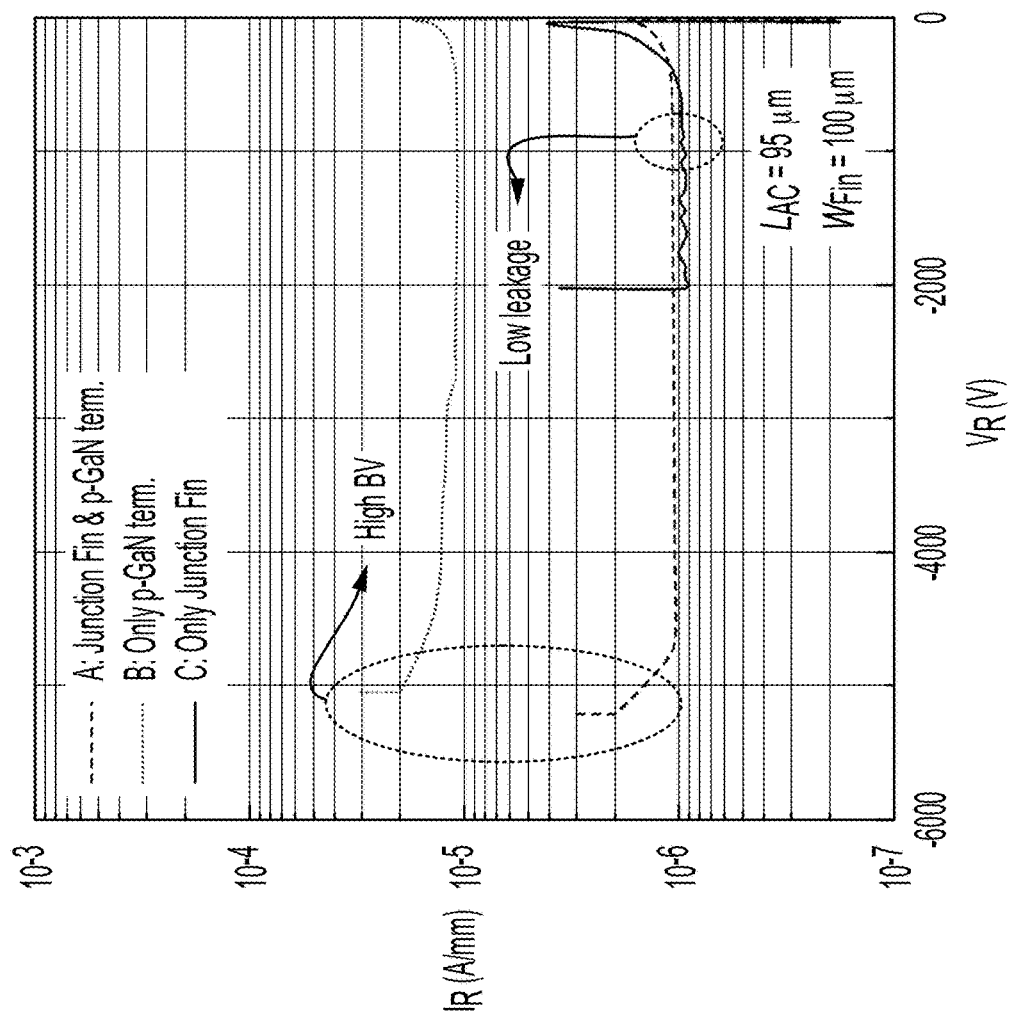
FIG. 18

POWER SCHOTTKY BARRIER DIODES WITH HIGH BREAKDOWN VOLTAGE AND LOW LEAKAGE CURRENT

TECHNICAL FIELD

This disclosure relates to the semiconductor devices, an in particular to Schottky barrier diodes.

DESCRIPTION OF THE RELATED TECHNOLOGY

High-voltage rectifiers are widely used in industrial motor drives, pulsed power systems, and power grid applications (see, for example, reference [1]). Some examples of high-voltage diodes include bipolar silicon p-n diodes and unipolar silicon carbide Schottky barrier diodes (SBDs) and junction barrier Schottky (JBS) diodes, which are purported to operate at as high as 10 kV (see, for example, reference [2]). bipolar silicon p-n diodes can suffer from poor reverse recovery. Gallium nitride (GaN) devices such as, for example, high-electron mobility transistors (HEMTs) and vertical GaN transistors also can operate at high voltages (see, for example, reference [3]). However, these devices can exhibit higher turn-on voltages than silicon carbide SBDs.

SUMMARY

In one aspect of the disclosure, a diode includes a semiconductor region having at least one two-dimensional carrier channel of a first conductivity type, the first conductivity type being one of a n-type and a p-type conductivity. The diode further includes a plurality of sidewalls exposed in the semiconductor region defining at least one trench extending through the at least one two-dimensional carrier channel. The diode also includes a material of a second conductivity type, the second conductivity type being the other of the n-type and the p-type conductivity, disposed on the plurality of sidewalls and in contact with the at least one two-dimensional carrier channel. The diode further includes an anode material in contact with at least a portion of the semiconductor region and in contact with at least a portion of the material of the second conductivity type, and a cathode material in contact with the at least one two-dimensional carrier channel.

In some embodiments, the anode material additionally covers at least a portion of the plurality of sidewalls and forms a Schottky contact with the at least one two-dimensional carrier channel. In some embodiments, the material of the second conductivity type is disposed between the anode material and the portion of the plurality of sidewalls. In some embodiments, the anode material is in contact with at least one sidewall of the plurality of sidewalls and is in contact with the material of the second conductivity type that is in turn in contact with another sidewall of the plurality of sidewalls. In some embodiments, the anode material additionally covers at least a portion of a bottom surface of the at least one trench, and wherein the material of the second conductivity type is disposed between the anode material and the portion of the bottom surface.

In some embodiments, a portion of the material of the second conductivity type forms a lateral depletion region in conjunction with the semiconductor region, a portion of the anode forms a Schottky contact with the portion of the semiconductor region, and wherein the lateral depletion region is positioned between the Schottky contact and the cathode. In some embodiments, the plurality of sidewalls define the at least one trench as a cavity in the semiconductor region. In some embodiments, the material of the second conductivity type completely fills the cavity in the semiconductor region. In some embodiments, the material of the second conductivity type has a top surface in the cavity, and wherein the top surface of the material of the second conductivity type is coplanar with a top surface of the semiconductor region. In some embodiments, the material of the second conductivity type additionally covers at least a portion of a top surface of the semiconductor region, and wherein the anode material is disposed over the material of the second conductivity type over the portion of the top surface of the semiconductor region.

In some embodiments, the material of the second conductivity type includes a first material of the second conductivity type and a second material of the second conductivity type, wherein the first material of the second conductivity type covers a portion of a top surface of the semiconductor region, and wherein the second material of the second conductivity type is disposed on the plurality of sidewalls. In some embodiments, the anode material covers portions of the plurality of sidewalls not covered by the second material of the second conductivity type. In some embodiments, the plurality of sidewalls define a plurality of fins interspaced with a plurality of the at least one trench, wherein the anode material forms a Schottky contact with the at least one two-dimensional carrier channels exposed on at least one sidewall outside of the plurality of the at least one trench. In some embodiments, the anode material additionally covers at least a portion of the plurality of sidewalls and forms a Schottky contact with at least one two-dimensional carrier channel, and wherein under reverse bias voltage conditions on the diode, a peak of a resulting electric field within the diode is positioned away from a position of the Schottky contact. In some embodiments, the semiconductor region includes at least one III-nitride material.

In some embodiments, the diode further includes a substrate layer, and a buffer layer disposed over the substrate layer, where the semiconductor region having the at least one two-dimensional carrier channel of a first conductivity type is disposed over the buffer layer. In some embodiments, a reverse breakdown voltage of the diode is about 5 kV and a reverse leakage current is less than or equal to 1.4 μA/mm. In some embodiments, the at least at least one two-dimensional carrier channel is formed at an interface of an aluminum gallium nitride material and a gallium nitride material. In some embodiments, the plurality of sidewalls define a plurality of fins interspaced with a plurality of the at least one trench, wherein the anode material forms a Schottky contact with the at least one two-dimensional carrier channels exposed on at least one sidewall outside of the plurality of the at least one trench, and wherein a width of at least one fin of the plurality of fins is between 100 nm and 1000 nm. In some embodiments, a spacing between the plurality of fins is between 100 nm and 1000 nm.

BRIEF DESCRIPTION OF THE DRAWINGS

FIGS. 2A-2D show portions of the Schottky diode 100 shown in FIG. 1 along various cross-sections.

FIG. 3 shows the I-V characteristics of two anode material pads on a material of second conductivity type as well as a simulated energy diagram along a fin of the Schottky diode shown in FIG. 1.

FIG. 7 shows a portion of a cross-sectional view of yet another example Schottky diode along a lateral axis.

FIG. 8 shows a portion of a cross-sectional view of another example Schottky diode along a lateral axis.

FIG. 17 shows pie-charts of the calculated turn on resistance for various lengths of the Schottky diode.

FIG. 18 shows graphs representing example reverse I-V characteristics of the Schottky diode shown in FIG. 1.

Like reference numbers and designations in the various drawings indicate like elements.

DETAILED DESCRIPTION

Figure 1:
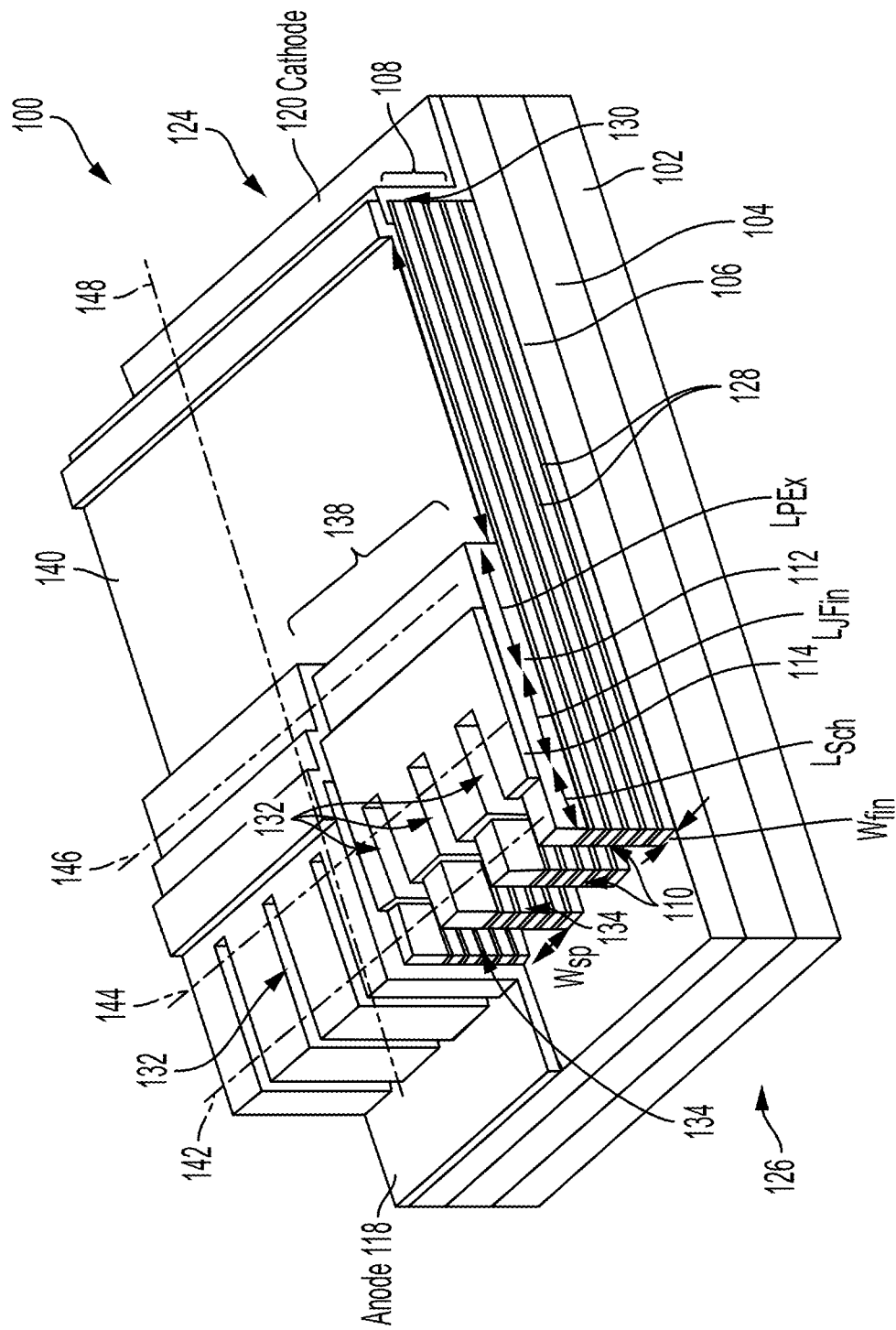
FIG. 1 shows a first example Schottky diode having a plurality of trenches in an anode region.

The various concepts introduced above and discussed in greater detail below may be implemented in any of numerous ways, as the described concepts are not limited to any particular manner of implementation. Examples of specific implementations and applications are provided primarily for illustrative purposes.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Prior to describing the various aspects of the present disclosure, the following definitions are provided and should be used unless otherwise indicated. Additional terms may be defined elsewhere in the present disclosure.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of" Similarly, the term "consisting essentially of" is intended to include examples encompassed by the term "consisting of.

As used herein, the term "and/or" includes any and all combinations of one or more of the associated listed items. Expressions such as "at least one of," when preceding a list of elements, modify the entire list of elements and do not modify the individual elements of the list.

As used in the specification and the appended claims, the singular forms "a," "an" and "the" include plural referents unless the context clearly dictates otherwise. Thus, for example, reference to "a proton beam degrader," "a degrader foil," or "a conduit," includes, but is not limited to, two or more such proton beam degraders, degrader foils, or conduits, and the like.

The various concepts introduced above and discussed in greater detail below may be implemented in any of numerous ways, as the described concepts are not limited to any particular manner of implementation. Examples of specific implementations and applications are provided primarily for illustrative purposes.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e., one atmosphere).

In some traditional Schottky barrier diodes (SBDs) (also referred to herein as "Schottky diodes") the peak electric field is typically positioned at the Schottky contact between the metal and the semiconductor. Further, leakage current of the SBDs under high voltage is typically proportional to the peak electrical field across the Schottky contact. This relationship is typically non-linear and at times exponential. That is, the leakage current increases at a much faster rate than the increase in the reverse bias voltage across the diode. The Schottky contact may not be able to sustain high electrical fields during reverse bias, thereby degrading the reliability of the SBD.

The example Schottky diodes discussed herein provide high voltage operation that lowers the magnitude of the electrical field at the Schottky contact and reduces the leakage current. In particular, the example Schottky diodes include structures that allow migration of the peak electric field away from the Schottky contact. These structures allow the voltage drop across the diode to be predominantly present across the structure and not at the Schottky contact.

FIG. 1 shows a first example Schottky diode 100. In particular, the Schottky diode 100 can provide high voltage operation that lowers the magnitude of an electrical field at the Schottky contact between an anode and a semiconductor material of the Schottky diode 100. The Schottky diode 100 includes a substrate 102, a buffer layer 104 disposed on the substrate 102, and a gallium nitride layer (i-GaN layer 106) disposed on the buffer 104. The substrate 102 can be any suitable material over which the buffer layer 104 and the i-GaN layer 106 can be formed. The substrate 102 can include materials such as, for example, silicon, sapphire, diamond, silicon carbide (SiC), aluminum nitride (AlN), etc. The buffer layer 104 can improve the structural reliability of the Schottky diode 100 by forming a transition layer between the substrate 102 and the i-GaN layer 106. The buffer layer 104 can adjust for thermal mismatch between the substrate 102 and the i-GaN layer 106.

A semiconductor region 108 is formed over the i-GaN layer 106. The semiconductor region 108 includes alternating layers of aluminum gallium nitride (AlGaN) and GaN, also referred to as a AlGaN/GaN heterostructure. Spontaneous and strain induced polarization can lead to a high positive polarization in the AlGaN layer, resulting in at least one two-dimensional carrier channel 128. In some instances, the at least one two-dimensional carrier channel 128 can include at least one electron gas (2DEG) channel induced at the AlGaN/GaN interface. The 2DEG channels extend laterally between a first end 124 of the Schottky diode 100 and a second end 126 of the Schottky diode 100. The semiconductor region 108 can include one or more 2DEG channels. As each 2DEG channel is formed at an interface of a AlGaN layer and a GaN layer, multiple 2DEG channels can be formed by including multiple alternating AlGaN and GaN layers. In the example shown in FIG. 1, the semiconductor region 108 can have a first conductivity type of n-type. However, in some other examples, the semiconductor region 108 can have a p-type conductivity type instead. In some such examples, the semiconductor region 108 can include two-dimensional hole gas (2DHG) channels instead of 2DEG channels.

A cathode material 120 can be disposed near the first end of the Schottky diode 100. The cathode material 120 can be in contact with the semiconductor region 108, and in particular with the at least one two-dimensional carrier channel 128. The cathode material can be disposed on a sidewall of the semiconductor region 108 near the first end 124, such that the cathode material 120 is in contact with the at least one two-dimensional carrier channel 128. The cathode material 120 may also be disposed on at least a top portion of the semiconductor region 108 near the first end 124. For example, as shown in FIG. 1, at a corner 130 of the semiconductor region 108, the cathode material 120 can be disposed on a vertical sidewall of the semiconductor region 108 as well as a portion of the top surface adjacent to the sidewall of the semiconductor region 108. The cathode material 120 may also make contact with at least a portion of the i-GaN material 106.

At least one trench can be formed in the semiconductor region 108. As an example, FIG. 1 shows a plurality of trenches 132 formed in the semiconductor region 108 near the second end 126 of the semiconductor region 108. The trenches 132 can be defined by a plurality of sidewalls 134 that extend between the top surface of the semiconductor region 108 and the top surface of the i-GaN layer 106. The trenches 132 shown in FIG. 1 are open. That is, at least a portion of the sidewalls that define a trench is discontinuous. In some examples, portion of the sidewall extending between the top surface of the semiconductor region 108 and the top surface of the i-GaN layer 106 can be removed. The lack of a portion of the sidewalls can result in a plurality of fins 110 that are spaced apart to define the trenches 132. The sidewalls of the fins 110 expose the at least one two-dimensional carrier channel 128 formed within the semiconductor region 108.

At least one material of a second conductivity type that is different from the first conductivity type of the semiconductor material 108 can be disposed over the sidewalls that define the trenches 132. The second conductivity can be a p-type (n-type) conductivity if the first conductivity (e.g., the conductivity of the two-dimensional carrier channel 128) is n-type (p-type). The at least one material of the second conductivity type can include a p-GaN material 112 and a nickel oxide material 114. In some instances, the at least one material of the second conductivity type may include only one of the p-GaN material 112 and the nickel oxide material 114. The p-GaN material 112 is disposed over at least one of the sidewalls 134 of the trenches 132. The p-GaN material 112 can also be disposed over the top surface of the semiconductor region 108. The p-GaN material 112 disposed over the at least one of the sidewalls 134 can make contact with the at least one two-dimensional carrier channel 128. In some instances, as shown in FIG. 1, the p-GaN material 112 is disposed only over the top surface of the semiconductor region 108 over the fins 110. The nickel oxide material 114 can be disposed over the p-GaN material 112 as well as at least one of the sidewalls 134 of the trenches 132. The nickel oxide layer 114 may not cover the entirety of the sidewalls 134, and leave at least portions of the sidewalls 134 exposed, which, as discussed below, can be covered by an anode material.

An anode material 118 can be disposed near the second end 128 of the Schottky diode 100. It should be noted that FIG. 1 shows the Schottky diode 100 where a portion of the anode material 118 and a passivation material 140 in a region 138 has been peeled to reveal the underlying structure of the Schottky diode 100. Normally, the anode material 118 could extend laterally over the entire width (measured perpendicular to a longitudinal axis that extends between the first end 124 and the second end 126) of the Schottky diode 100. The anode material 118 can be disposed over at least a portion of the semiconductor region 108. The anode material can cover the portions of the sidewalls 134 within the trenches 132 that are not covered by the at least one material of the second conductivity type. For example, the anode material 118 can cover the sidewalls 134 that are exposed within the trenches 134 and not covered by the nickel oxide material 114. The anode material 114 can make contact with the semiconductor region 108 to form a Schottky contact. The anode material 114 is also disposed over the at least one material of the second conductivity type. Specifically, the anode material 114 can be disposed over at least a portion of one or both of the p-GaN material 112 and the nickel oxide material 114. A portion of the anode material 118 may also cover a top surface of the i-GaN layer 106. The passivation material 140 can be disposed over a portion of the top surfaces of the Schottky diode 100. In particular, the passivation material 140 can be disposed over a portion of the anode material 118, a portion of the nickel oxide material 114 not covered by the anode material 118, a portion of the p-GaN material 112 not covered by the anode material 118 or the nickel oxide material 114, a portion of the semiconductor region 108 and a portion of the cathode material 120.

FIGS. 2A-2D show portions of the Schottky diode 100 shown in FIG. 1 along various cross-sections. In particular, FIG. 2A shows a cross-sectional view of the Schottky diode 100 along a first axis 142, FIG. 2B shows a cross-sectional view of the Schottky diode 100 along a second axis 144, FIG. 2C shows a cross-sectional view of the Schottky diode 100 along a third axis 146, and FIG. 2D shows a cross-sectional view of the Schottky diode 100 along a fourth axis 148. FIG. 2A shows a Schottky fin region that includes a Schottky contact between the anode material 118 and the semiconductor region 108 along a sidewall 134. FIG. 2B shows a junction fin region that includes p-GaN material 112 disposed over the top surface of the semiconductor region 108, and the nickel oxide material 114 disposed over the p-GaN material 112 as well as the sidewalls 134 defining the trenches 132. FIG. 2C shows a planar portion of the semiconductor region 108 over which the p-GaN material 112 and the passivation material 140 are disposed.

As shown in FIG. 2D, the Schottky diode 100 can be viewed as a series connection of a Schottky barrier diode 202, junction fin gated high electron mobility transistor (HEMT) 204, and a planar p-gate HEMT 206. During an ON state of the Schottky diode 100 (i.e., when the Schottky diode 100 is forward biased), the junction fin-gated HEMT 204 and the planar p-gated HEMT 206 can be normally ON, ensuring a small $R_{on}$. The magnitude of the threshold voltage ($|V_{th}^{fin}|$) of the junction fin-gated HEMT 204 is relatively less than magnitude of the threshold voltage ($|V_{th}^{plan}|$) of the planar p-gate HEMT 206 (i.e., $|V_{th}^{fin}|<|V_{th}^{plan}|$) When a reverse bias voltage ($V_R$) across the Schottky diode 100 increases, the junction fin-gated HEMT 204 and the planar p-gate HEMT 206 switch OFF. The voltage drop ($V_{Sch}$) across the Schottky junction at the Schottky barrier diode 202 would then saturate to $|V_{th}^{fin}|$, which determines the reverse leakage current ($I_R$). The nickel oxide material 114 forms a lateral depletion region with the at least one two-dimensional carrier channel 128 to form the junction fin-gated HEMT 204 in conjunction with the p-GaN material 112. The strong depletion in the fins 110 can reduce the magnitude of $|V_{th}^{fin}|$, and therefore the magnitude of the reverse leakage current ($I_R$). In addition, the planar p-gated HEMT 206 sustains a large portion ($V_R-|V_{th}^{plan}|$) of the reverse bias voltage ($V_R$).

As a result, the peak electric field is moved away from the Schottky barrier diode 202. This is in contrast with traditional Schottky diodes, where the peak electric field, during reverse bias, fall across the Schottky contact, i.e., at the interface of the anode material 118 and the semiconductor region 108. Further, in traditional Schottky diodes, the reverse leakage current ($I_R$) is typically proportional to the peak electric field across the Schottky contact. By moving the peak electric field away from the Schottky contact, the Schottky diode 100 exhibits lower reverse leakage current ($I_R$) as well as reduces the risk of the damage to the Schottky contact under high peak electric fields. The Schottky diode 100 achieves the positioning of the peak electric field away from the Schottky contact in part by positioning the material of second conductivity type (the p-GaN material 112 and the nickel oxide material 114) in contact with the at least one two-dimensional carrier channel 128 in the semiconductor region 108 between the Schottky contact and the cathode 120. As a result, the peak electric field is formed at the interface of the material of the second conductivity type and the semiconductor region 108, as opposed to at the Schottky contact as in traditional Schottky diodes.

FIG. 3 shows the I-V characteristics of two anode material pads on a material of second conductivity type as well as a simulated energy diagram along a fin. In particular, the graph on the left shows an I-V curve between two nickel pads (an example anode material) disposed on NiO (an example material of second conductivity type). The structure shown on the left of FIG. 3 was fabricated, and Hall measurements were carried out to determine the resulting hole density of $5\times10^{19}$ cm$^3$. This enables high built-in potential ($V_{bi}$) between the NiO and the i-GaN materials, which in turn results in stronger depletion region. Almost all of the built-in potential falls across the fins, as shown in the energy diagram to the right of the FIG. 3. Due to high hole concentration in the NiO material, almost all the depletion of NiO/i-GaN junction appears at the fin 110.

Figure 4:
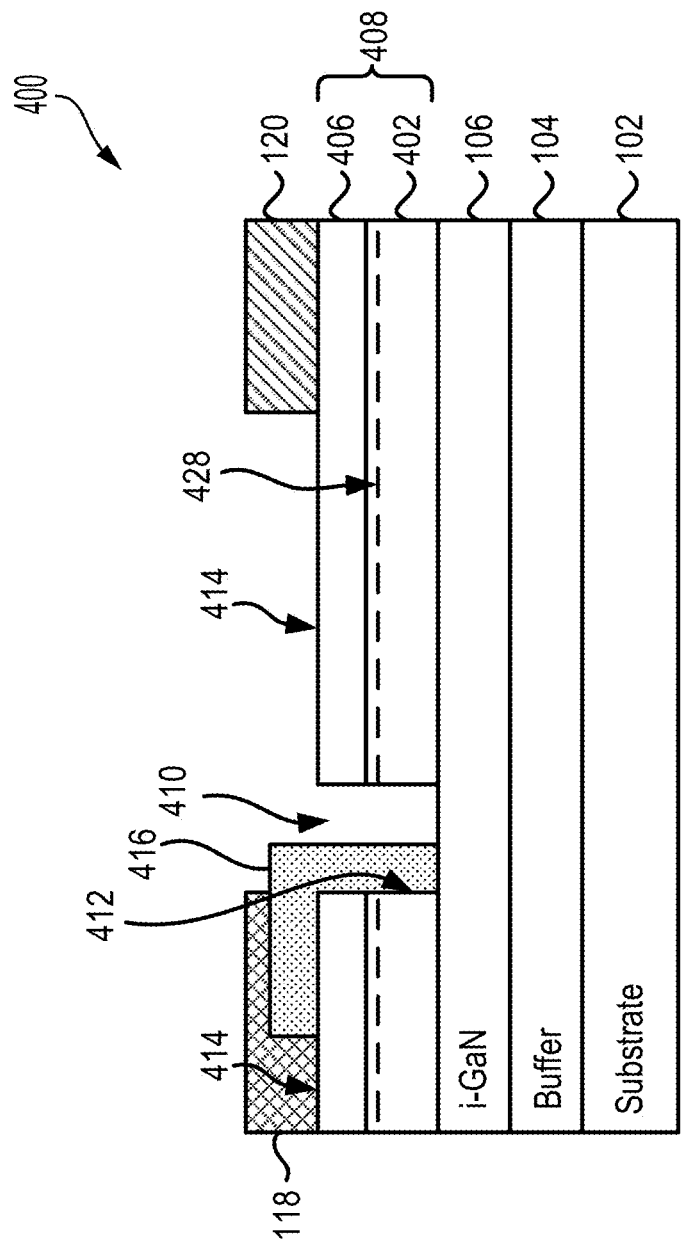
FIG. 4 shows a second example Schottky diode having a single two-dimensional carrier channel.

FIG. 4 shows a second example Schottky diode 400 having a single two-dimensional carrier channel. The second example Schottky diode 400 is similar in many respects to the Schottky diode 100 discussed above in relation to FIGS. 1-3. For example, the second example Schottky diode 400 shown in FIG. 4 also includes a substrate 102, a buffer layer 104, and an i-GaN layer 106. In addition, similar to the Schottky diode 100, the second example Schottky diode 400 also includes a semiconductor region 408 and at least one trench 410 similar to the at least one trench 132 shown in FIG. 1. The view of the Schottky diode 400 shown in FIG. 4 can be, for example, along an axis similar to the fourth axis 148 shown in FIG. 1. The Schottky diode 400 can include one or more sidewalls that expose the single two-dimensional carrier channel 428. Unlike the Schottky diode 100 shown in FIG. 1, the second example Schottky diode 400 includes only a single pair of AlGaN/GaN layers. In particular, the GaN layer 402 is disposed on the i-GaN layer 106 and an AlGaN layer 406 is disposed over the GaN layer 402. A single two-dimensional carrier channel 428 is formed at the interface of the AlGaN layer and GaN layers. The second example Schottky diode 400 further includes at least one trench 410 formed in the semiconductor region 408. A plurality of sidewalls 412 can define the at least one trench 410. While the cross-sectional view shown in FIG. 4 illustrates only a single trench, it is understood that the second example Schottky diode 400 can include more than one trench. Furthermore, the at least one trench 410 shown in FIG. 4 can be an open trench, such as that shown in FIG. 1, or can be a closed trench, where the plurality of sidewalls 412 form a continuous inner surface that defines the closed trench.

A material of the second conductivity type 416 can be dispose on the semiconductor region 408. In particular, the material of the second conductivity type 416 can be disposed over at least a portion of the sidewall 412 such that the material is in contact with the single two-dimensional carrier channel 428. The material of the second conductivity type 416 can be similar to the material of the second conductivity type discussed above in relation to FIG. 1, in that the material can include one or more materials of the second conductivity type such as, for example, p-GaN and NiO. The material of the second conductivity type 416 and the semiconductor region 408 form a lateral depletion region along the sidewalls 412. As discussed above in relation to the Schottky diode 100, the formation of the lateral depletion region along the sidewalls of a trench in the semiconductor material 408 causes the peak electric field, during reverse bias, to be positioned away from the Schottky contact formed between the anode material and the semiconductor region 408.

The anode material 118 is disposed over a top surface 414 of the semiconductor region 408. Because the semiconductor region 408 includes only a single two-dimensional carrier channel 428, the anode material 118 need not make contact with the sidewall. Instead, the anode material 118 can make a planar contact with the AlGaN material to form a Schottky contact with the semiconductor region 408. The anode material 118 is positioned such that the lateral depletion region formed by the material of the second conductivity type 416 is positioned between the Schottky contact formed by the anode material 118 and the cathode 120.

Figure 5:
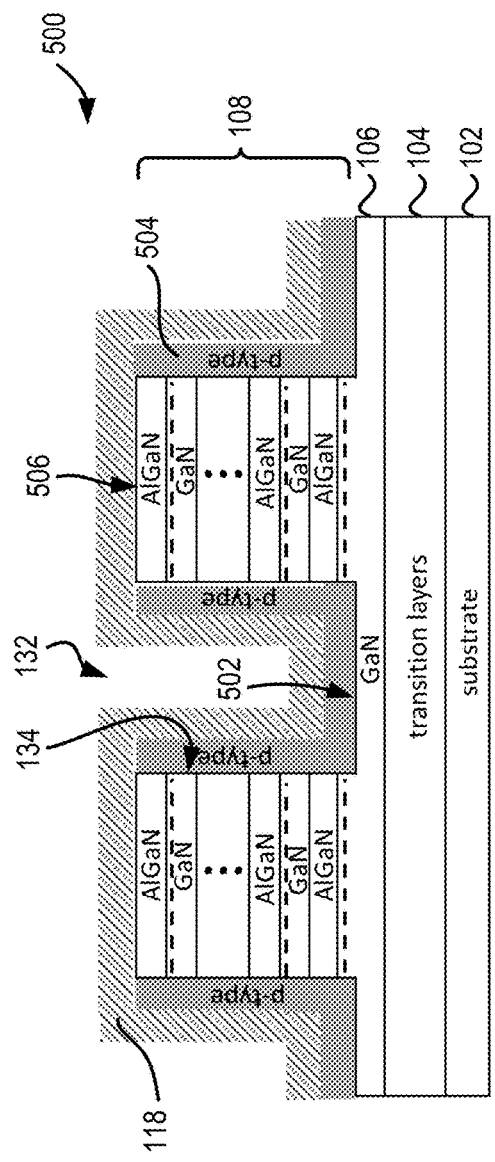
FIG. 5 shows a portion of a cross-sectional view of another example Schottky diode along a lateral axis.

FIG. 5 shows a portion of a cross-sectional view of another example Schottky diode 500 along a lateral axis. In particular, the lateral axis can be positioned in a manner similar to that of the first axis 142 or the second axis 144. The cross-sectional view shows a substrate 102, over which the buffer layer 104 is disposed. The i-GaN layer 106 is disposed over the buffer layer 104. The semiconductor region 108 is formed over the i-GaN layer 106, where the semiconductor region 108 includes a plurality of two-dimensional carrier channel 128. A plurality of sidewalls 134 define one or more trenches 132. The plurality of sidewalls 134 can form an inner surface that is continuous, which can correspond to a closed trench 132, or can form an inner surface that is discontinuous, corresponding to an open trench 132, such as the one shown in FIG. 1. The trenches 132 can also be defined in part by a bottom surface 502, which can be the top surface of the i-GaN layer 106. The anode material 118 covers at least a portion of the bottom surface 502 of the trench 132. Furthermore, the material of the second conductivity type 504 is disposed between the anode material 118 and at least a portion of the bottom surface 502. In a similar manner, the anode material 118 covers a portion of the sidewalls 134, and the material of the second conductivity type 504 is disposed between the anode material 118 and the portion of sidewalls 134. The anode material 118 can also be disposed over a top surface 506 of the semiconductor region 108. However, the material of the second conductivity type 504 may not be disposed between the anode material 118 and the top surface 506. The material of the second conductivity type 504 can form a lateral depletion region within the semiconductor region 108. The material of the second conductivity type can include a single material or include two or more different materials. For example, as discussed above in relation to the Schottky diode 100 shown in FIG. 1, the material of the second conductivity type can include p-GaN material 112 and nickel oxide material 114 that is doped with the p-type conductivity. The conductivity type of these materials can be of the n-type, if the first conductivity type of the two-dimensional carrier channel 128 is p-type. The Schottky contact can be formed on a planar surface, e.g., the top surface 506 of the semiconductor region 108. With the presence of a Schottky contact on the planar surface, there may not be a need to also include a sidewall Schottky contact between the anode material 118 and the at least one two-dimensional carrier channel 128.

Figure 6:
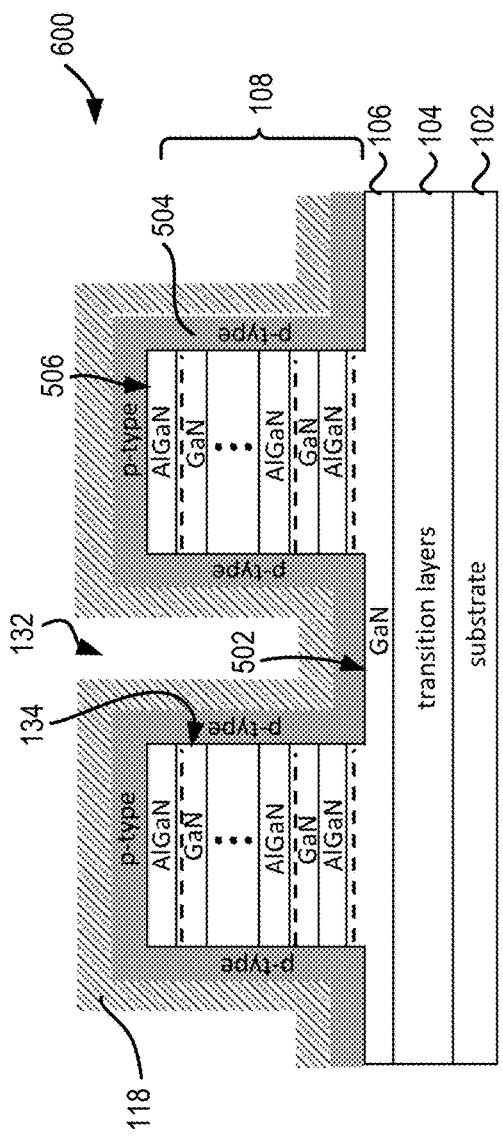
FIG. 6 shows a portion of a cross-sectional view of another example Schottky diode along a lateral axis.

FIG. 6 shows a portion of a cross-sectional view of another example Schottky diode 600 along a lateral axis. The Schottky diode 600 is in many respects similar to the Schottky diode 500 discussed above in relation to FIG. 5. However, in the Schottky diode 600 shown in FIG. 6, the material of the second conductivity type 504 also covers at least a portion of the top surface 506 of the semiconductor region 108. In addition, the anode material 118 is also disposed over at least a portion of the material of the second conductivity type 504 on the top surface 506. Thus, at least a portion of the material of the second conductivity type 504 is positioned between the anode material 118 and the top surface 506 of the semiconductor region 108. Having the material of the second conductivity type 504 on at least a portion of the top surface 506 of the semiconductor region 108 can allow formation of depletion regions not only along the sidewalls but also along the top surface 506.

FIG. 7 shows a portion of a cross-sectional view of yet another example Schottky diode 700 along a lateral axis. The Schottky diode 700 is in many respects similar to the Schottky diodes 500 and 600 discussed above in relation to FIGS. 5 and 6. However, in the Schottky diode 700 shown in FIG. 7, the material of the second conductivity type 504, not only covers the sidewalls 134 and the bottom surface 502 of the trenches 132, but also fills the cavity of the trench 134 formed in the semiconductor region 108. The material of the second conductivity type 504 can have a top surface 702 that can be coplanar with the top surface 506 of the semiconductor region 108. The anode material 118 is disposed over the top surface 702 of the material of the second conductivity type 502 as well as the top surface 506 of the semiconductor region 108. The anode material 118 is not disposed over the sidewalls 134 of the trenches 132. The anode material 118 may also not make direct contact with the bottom surface 502 of the trenches 132. By filling the trenches 132 with the material of the second conductivity type 504, the anode material 118 can be planar and therefore avoid processes stages that would otherwise be needed to deposit the anode material 118 on one or more sidewalls.

FIG. 8 shows a portion of a cross-sectional view of another example Schottky diode 800 along a lateral axis. The Schottky diode 800 shown in FIG. 8 is in many respects similar to the Schottky diode 700 shown in FIG. 7. However, unlike the Schottky diode 700 in FIG. 7 where the material of the second conductivity type 504 is not disposed over the top surface of the semiconductor region 108, the material of the second conductivity type 504 is disposed over at least a portion of the top surface of the semiconductor region 108. Furthermore, the material of the second conductivity type is disposed between the anode material 118 and the top surface 506 of the semiconductor region 108. A top surface 802 of the material of the second conductivity type 504 is not coplanar with the top surface of the semiconductor region 108. The material of the second conductivity type 504 covers not only the cavity of the trenches 132, but also the top surfaces of the semiconductor region 108. The anode material 118 is not disposed over the sidewalls 134 of the trenches 132. The anode material 118 may also not make direct contact with the bottom surface 502 of the trenches 132.

Figure 9:
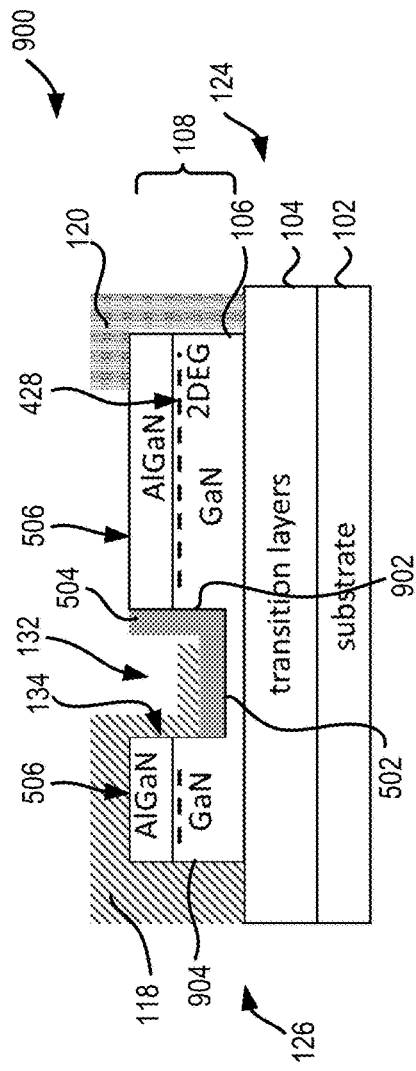
FIG. 9 shows a portion of a cross-sectional view of another example Schottky diode along a longitudinal axis.

FIG. 9 shows a portion of a cross-sectional view of another example Schottky diode 900 along a longitudinal axis. In particular, the longitudinal axis can be positioned in a manner similar to the fourth axis 148 shown in FIG. 1 that extends between the first end 124 and the second end 126 of the Schottky diode 100. The Schottky diode 800 includes a single two-dimensional carrier channel 428, similar to that discussed above in relation to FIG. 4. The material of the second conductivity type 504 is disposed over at least a portion of the bottom surface 502 of the trench 132 as well as at least a portion of a sidewall 902 that defines the trench 132. The anode material 118 is in contact with at least a portion of another sidewall 134 that defines the trench 132 and is disposed over the material of the second conductivity type 504 over the bottom surface 502 of the trench 132. The anode material 118 also covers an outer sidewall 904 of the semiconductor region 108, where the outer sidewall 904 can be outside of the trench 132, that is, the outer sidewall 904 does not define the trench 132. The anode material 118 also covers a portion of the top surface 506 of the semiconductor region 108, thereby making a planar contact with the single two-dimensional carrier channel 428 of the semiconductor region 108. The cathode material 120 is disposed on the semiconductor region 108 at the first end 124 of the Schottky diode 900.

Figure 10:
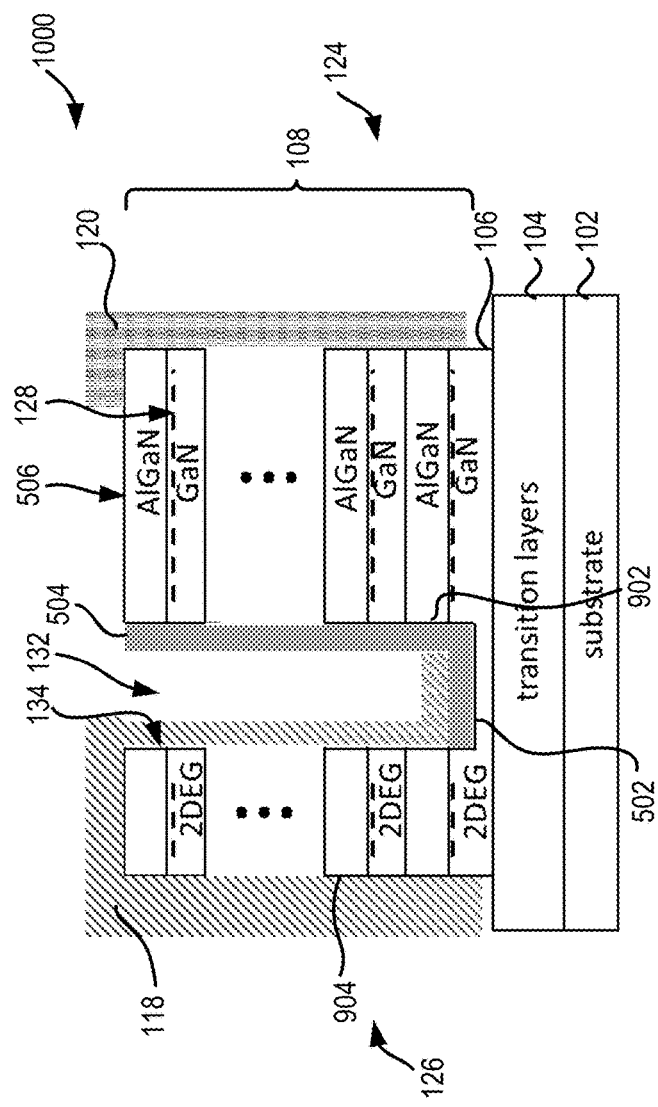
FIG. 10 shows a portion of a cross-sectional view of another example Schottky diode along a longitudinal axis.

FIG. 10 shows a portion of a cross-sectional view of another example Schottky diode 1000 along a longitudinal axis. The Schottky diode 1000 is in many respects similar to the Schottky diode 900 shown in FIG. 9. However, the Schottky diode 1000 includes a plurality of two-dimensional carrier channels 128. The anode material 118 is in contact with at least one sidewall 134 that defines the trench 132 and is disposed over the material of the second conductivity type 504 over the bottom surface 502 of the trench 132.

Figure 11:
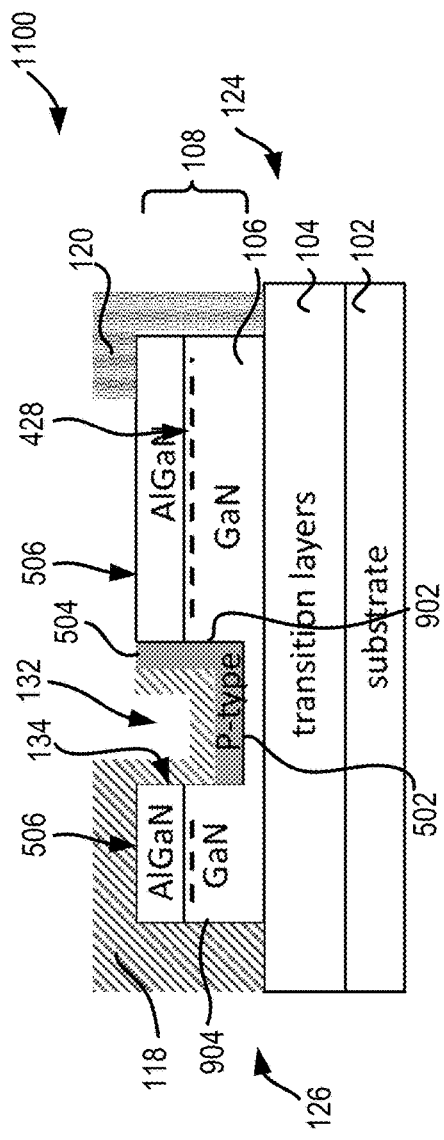
FIG. 11 shows a portion of a cross-sectional view of another example Schottky diode along a longitudinal axis.

FIG. 11 shows a portion of a cross-sectional view of another example Schottky diode 1100 along a longitudinal axis. The Schottky diode 1100 shown in FIG. 11 is in many respects similar to the Schottky diode 900 discussed above in relation to FIG. 9. However, the Schottky diode 1100 includes the anode material 118 that also covers a portion of the sidewall 902 over which the material of the second conductivity type 504 is disposed. Thus, at least one sidewall of the trench 132 has the material of the second conductivity type 504 disposed between the at least one sidewall and the anode material 118.

Figure 12:
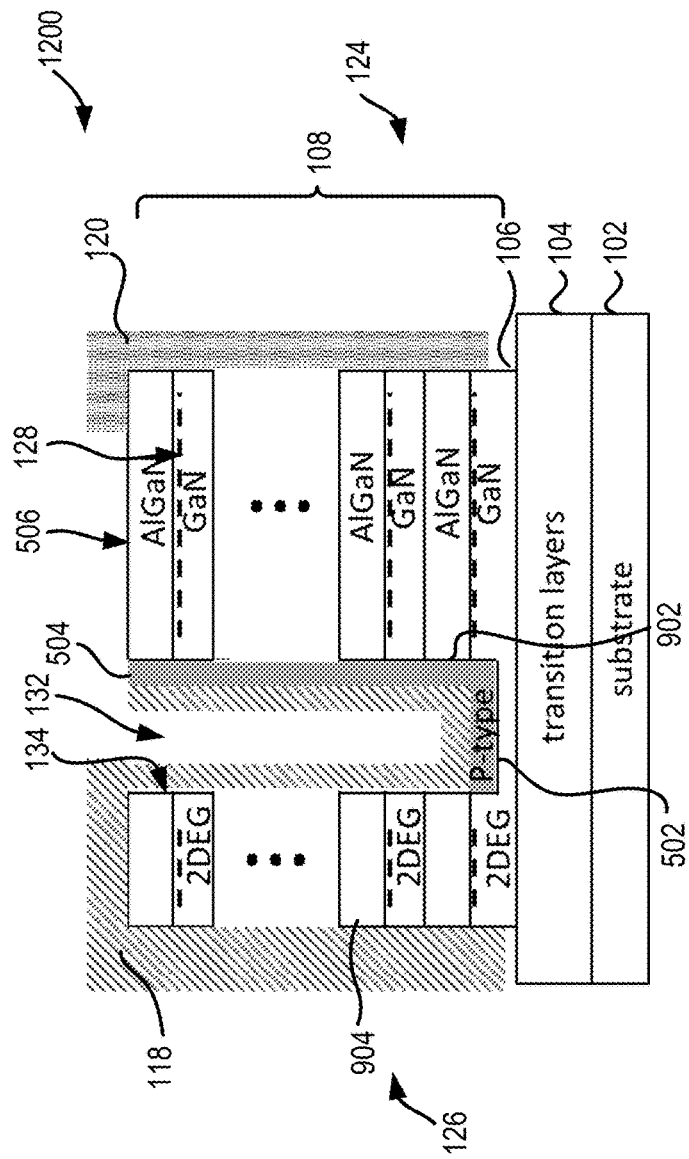
FIG. 12 shows a portion of a cross-sectional view of another example Schottky diode along a longitudinal axis.

FIG. 12 shows a portion of a cross-sectional view of another example Schottky diode 1200 along a longitudinal axis. The Schottky diode 1200 shown in FIG. 12 is in many respects similar to the Schottky diode 1000 shown in FIG. 10 in that like the Schottky diode 1000, the Schottky diode 1200 in FIG. 12 also includes a plurality of two-dimensional carrier channel 128. The Schottky diode 1200 is also similar to the Schottky diode 1100 shown in FIG. 11 in that like the Schottky diode 1100, the Schottky diode 1200 in FIG. 12 also includes at least one sidewall 902 that has the material of the second conductivity type disposed between the anode material 118 and the sidewall 902. In FIGS. 9-12, the anode material 118 is disposed on the sidewalls within the trenches 132 as well as outside of the trenches 132, thereby providing a larger Schottky contact area.

Figure 13A:
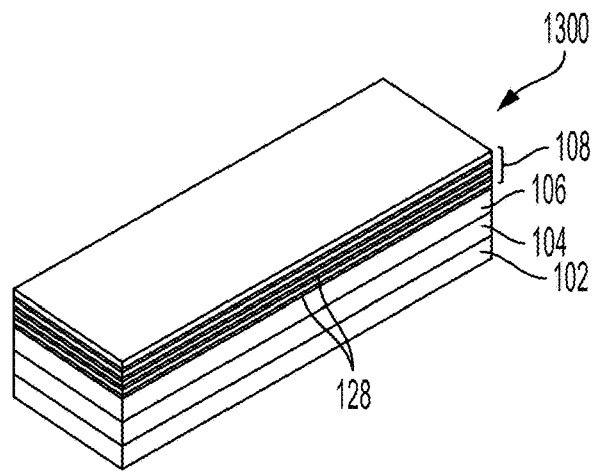
FIGS. 13A-13H illustrates an example process of forming a Schottky diode.

FIGS. 13A-13H illustrates an example process of forming a Schottky diode. In particular, FIGS. 13A-13H illustrate various stages in the fabrication of the Schottky diode such as the Schottky diode 100 shown in FIG. 1. It should be noted that the process shown in FIGS. 13A-13H can be easily modified to form the other example Schottky diodes discussed above in relation to FIGS. 4-12. FIG. 13A shows a stage in the fabrication of the Schottky diode 1300 where layers of the substrate 102, the buffer layer 104, the i-GaN layer 106 and the semiconductor region 108 are formed. The semiconductor region 108 can be formed by depositing alternating layers of AlGaN and i-GaN material. For example, a metal-organic chemical vapor deposition (MOCVD) method can be utilized to deposit the AlGaN and the i-GaN materials. In some examples, the AlGaN material can include $Al_{0.3}Ga_{0.7}N$ having a thickness of about 20 nm to about 25 nm and the thickness of the i-GaN material can be about 60 nm to about 90 nm. These ranges of thicknesses are only example, and various implementations can have various thicknesses and relative thicknesses of the AlGaN and GaN materials. The formation of the alternating AlGaN and the i-GaN materials results in the formation of multiple two-dimensional carrier channels 128. As an example, the total density of the two-dimensional carrier channels can be between about $2 \times 10^{13}$ $cm^{-2}$ to about $6 \times 10^{13}$ $cm^{-2}$. In some examples, the values of mobility of the two-dimensional carrier channels can be between about 1200 $cm^2/Vs$ and about 1600 $cm^2/Vs$. In some examples, the sheet resistance $R_{SH}$ of the two-dimensional carrier channels can have a value between about 100 $\Omega/sq$ and about 120 $\Omega/sq$.

Figure 13B:
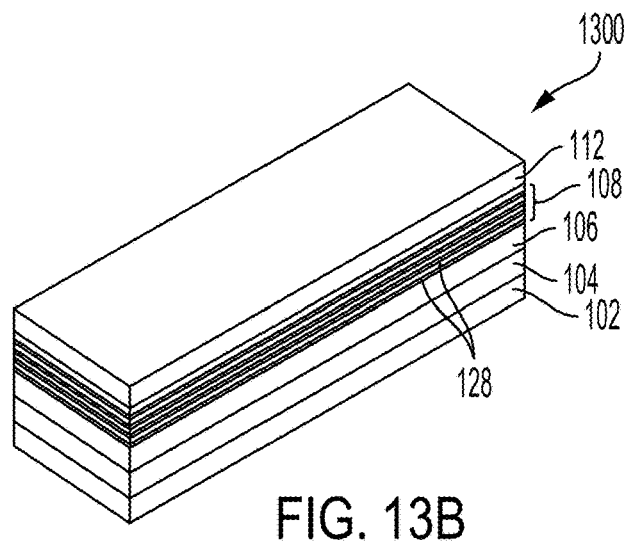
Figure 13C:
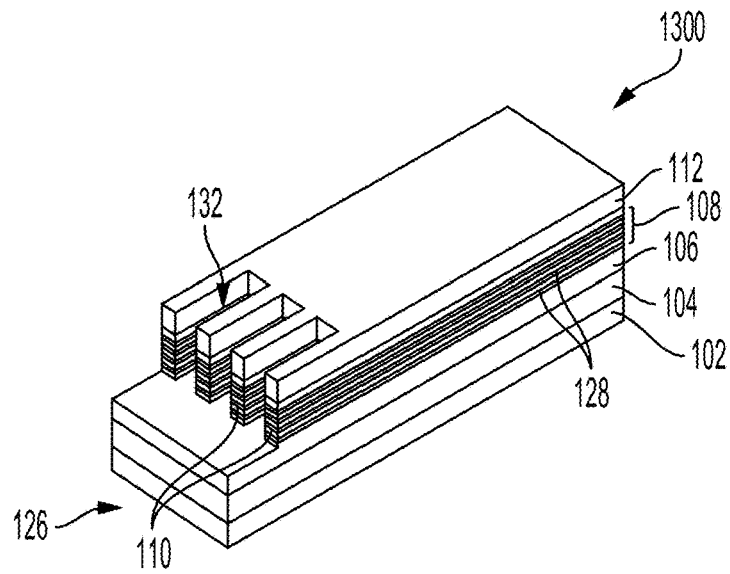

FIG. 13B shows the formation of the p-GaN material 112, which can be deposited using, for example, the MOCVD method, or any other deposition method. The p-GaN material 112. In some examples, the thickness of the p-GaN material 112 can be about 50 nm to about 800 nm. FIG. 13C shows the patterning of the trenches 132 near a second end 126 of the Schottky diode 1300. The trenches 132 can open trenches. That is, the sidewalls defining a trench 132 can be discontinuous. This results in openings in the trenches 132 facing the second end 126 and the formation of fins 110. In some examples, the trenches 132 can be closed, and can represent cavities such as those discussed above in relation to FIGS. 4-12.

Figure 13D:
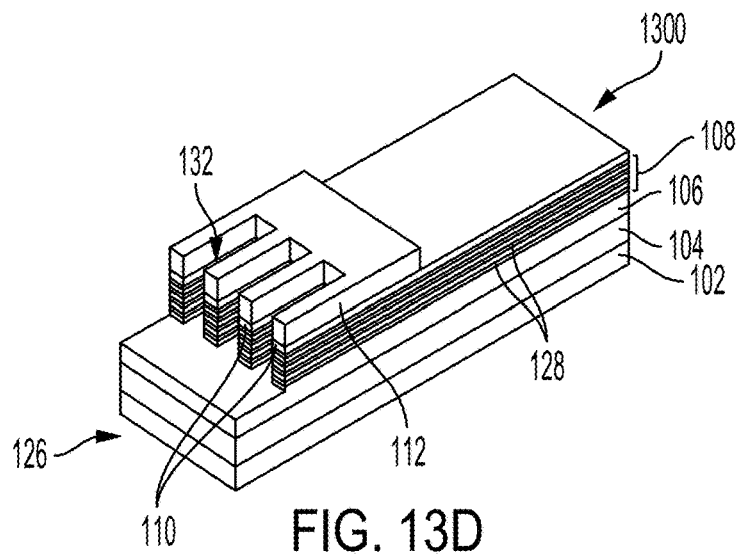
Figure 13E:
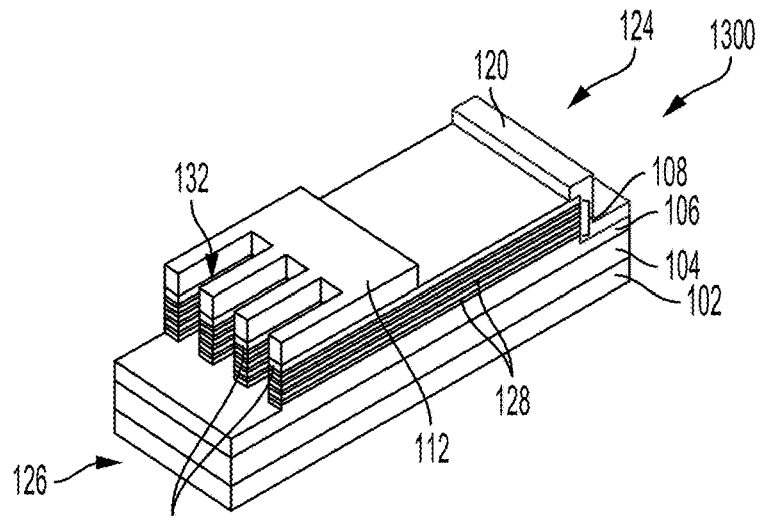
Figure 13F:
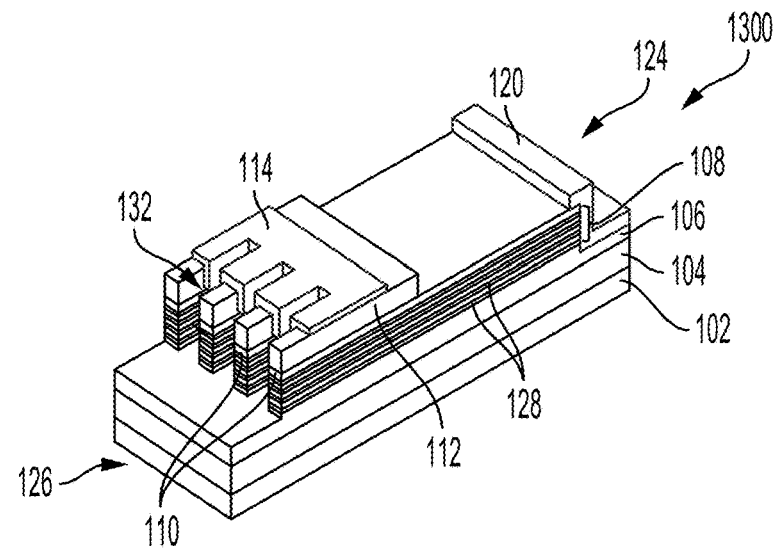
Figure 13G:
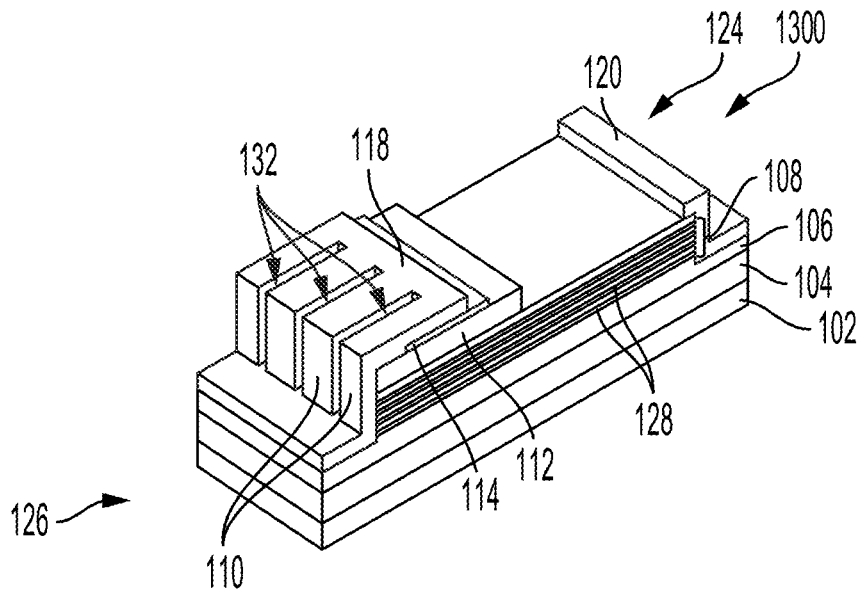
Figure 13H:
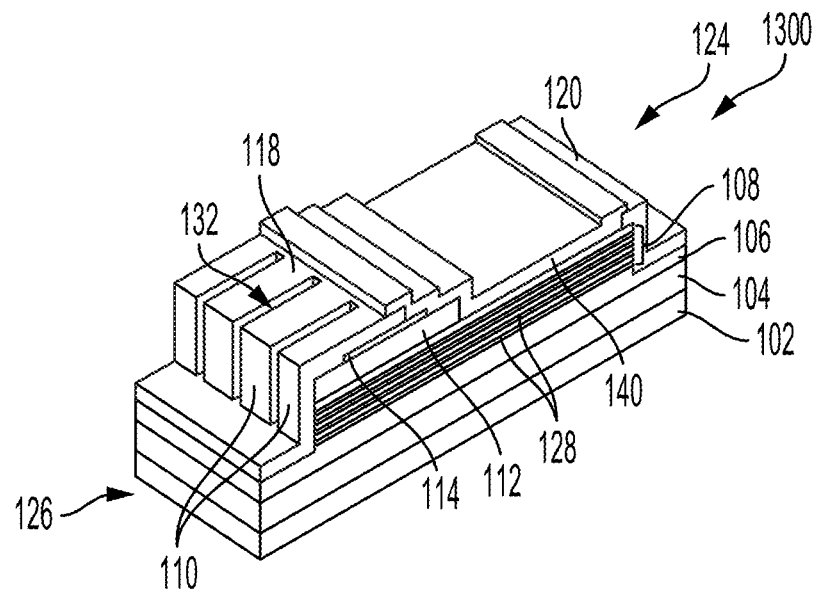

FIGS. 13D and 13E illustrate the patterned removal of the p-GaN material 112 from the surface of the semiconductor region 108 near the first end 124 of the Schottky diode 1300 and a patterned deposition of a cathode material 120. The cathode material 120 can be deposited over a portion of the top surface of the semiconductor region 108 that is near the first end 124. The cathode material can include metals such as, for example, titanium, aluminum, nickel, gold, and other suitable metals. FIG. 13F shows the deposition and patterning of the nickel oxide material 114 over the p-GaN material 112 and over a plurality of sidewalls of the trenches 132. The nickel oxide material 114 is patterned such that it covers only a portion of the sidewalls of the trenches 132. FIG. 13G illustrates the patterned deposition of the anode material 118 over the exposed sidewalls of the trenches 132, over the nickel oxide material 114 on the sidewalls of the trenches 132 as well as on the top surface of the Schottky diode 1300. The anode material 118 can include metals such as, for example, titanium, aluminum, nickel, gold, and other suitable metals. FIG. 13H shows the patterned deposition of the passivation material 140 over a portion of the anode material 118, exposed portions of the nickel oxide material 114 and the p-GaN material 112 as well as a portion of the cathode material 120.

Referring again to FIG. 1, a length ($L_{Sch}$) of a Schottky fin region can be represented as the distance, along the fourth axis 148, between an outer edge of the fins 110 and a position on the fin up to which the nickel oxide material 114 extends. In some examples, values of $L_{Sch}$ can have a range of about 0.5 μm to about 2.5 μm. A length ($L_{JFin}$) of a junction fin region can be represented as a distance, along the fourth axis 148, between the position on the fin up to which the nickel oxide material 114 extends and the sidewall of the trench 132 that is nearest to the first end 124 of the Schottky diode 100. In some examples, values of $L_{JFin}$ can have a range of about 0.5 μm to about 2.5 μm. The sum of the lengths $L_{Sch}$ and $L_{JFin}$ can represent a length of the fins 110. A length ($L_{PEx}$) of the p-GaN material 112 can be represented as the distance, along the fourth axis 148, between the sidewall of the trench 132 that is nearest to the first end 124 and the position on the top surface of the semiconductor region 108 up to which the p-GaN material 112 extends. In some examples, the values of $L_{PEx}$ can have a range of about 0.1 μm to about 8 μm. A width ($W_{fin}$) of the fins 110 can be represented as a distance between two edges of the fins along a direction that is normal to the fourth axis 148. In some examples, the values of $W_{fin}$ can have a range of about 100 nm to about 1000 nm. A fin spacing ($W_{sp}$) can be represented as a gap between two adjacent fins. In some examples, the values of $W_{sp}$ can have a range of about 100 nm to about 1000 nm.

Figure 14:
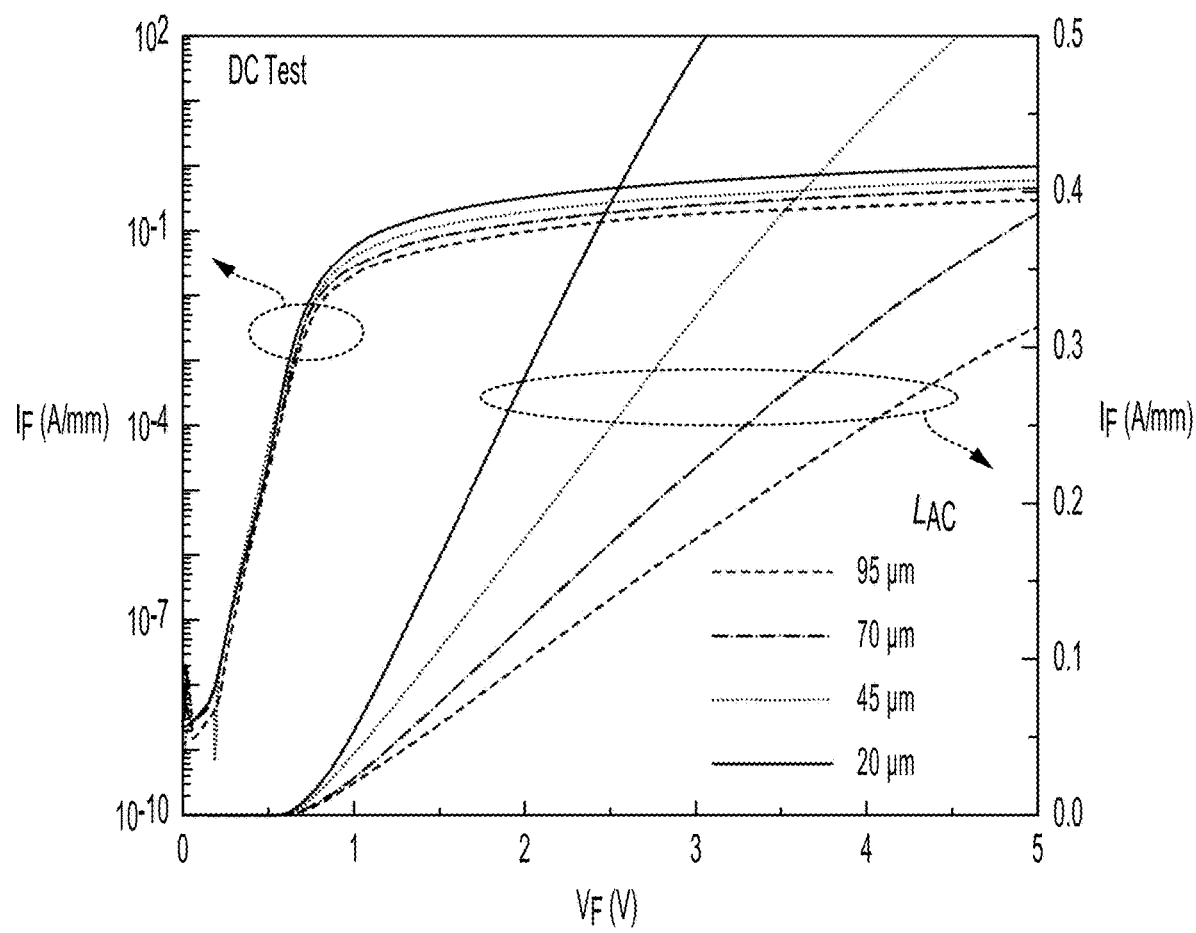
FIG. 14 shows a graph representing example forward I-V characteristics of the Schottky diode 100 shown in FIG. 1.

FIG. 14 shows a graph representing example forward I-V characteristics of the Schottky diode 100 shown in FIG. 1. In particular, FIG. 14 shows example forward I-V characteristics for various lengths $L_{AC}$ of the Schottky diode 100. The length $L_{AC}$ can represent the distance, along the fourth axis 148, between the extent of the p-GaN material 112 on the top surface of the semiconductor region 108 and the cathode 120. The $L_{AC}$ can vary from about 1 μm to about 200 μm. FIG. 14 shows that the turn on voltage $V_{ON}$ of the Schottky diode 100 can be about 0.66 V. The turn on resistance $R_{ON}$ can be determined to be about 1.4 to about 13.5 $m\Omega \cdot cm^2$ corresponding to the $L_{AC}$ values of about 20 μm to about 95 μm.

Figure 15:
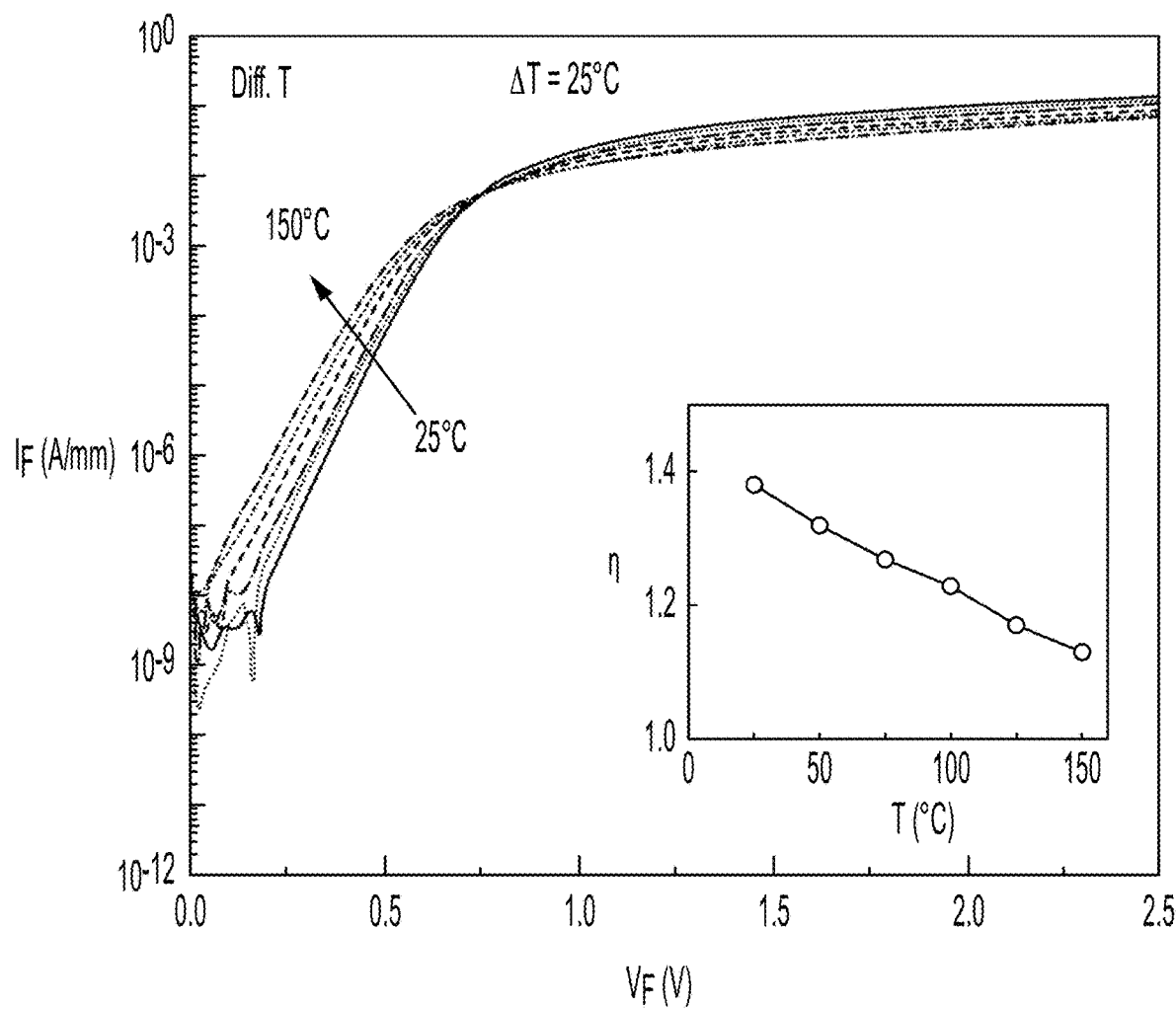
FIG. 15 shows a graph representing example forward I-V characteristics of the Schottky diode at various operating temperatures.

FIG. 15 shows a graph representing example forward I-V characteristics of the Schottky diode at various operating temperatures. The inset shows a graph of the ideality factor with respect to the temperature. At high temperatures up to 150° C., the ideality factor decreases from 1.38 to 1.13 with a small increase in the barrier height (0.59 eV to 0.64 eV), indicating good sidewall Schottky contact with barrier inhomogeneity. The ON resistance $R_{ON}$ can double from 25° C. to about 150° C.

Figure 16:
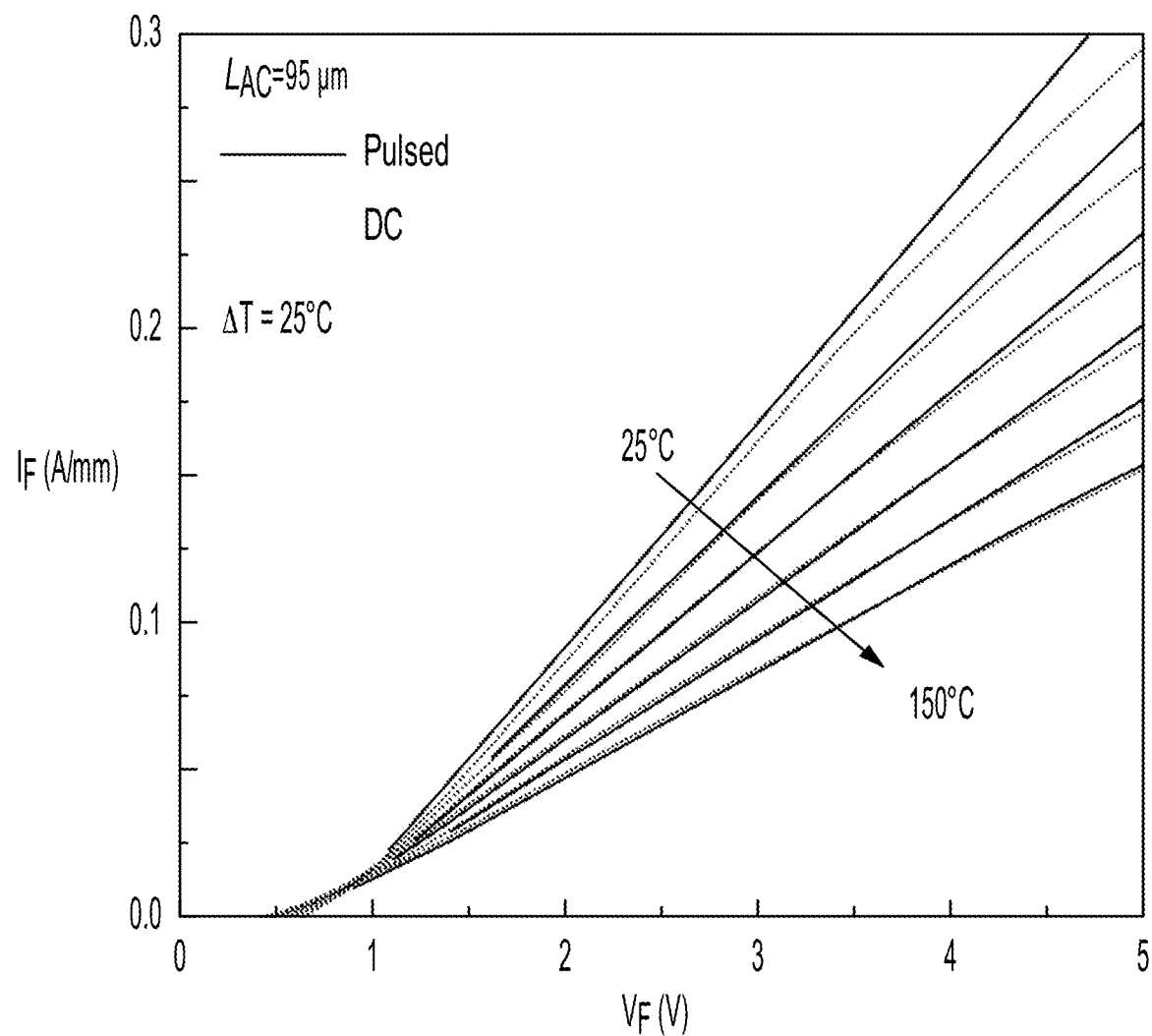
FIG. 16 shows a graph representing example forward I-V characteristics of the Schottky diode shown in FIG. 1 for various temperatures and for DC and pulsed measurements.

FIG. 16 shows a graph representing example forward I-V characteristics of the Schottky diode shown in FIG. 1 for various temperatures and for DC and pulsed measurements.

A relatively small discrepancy can be observed between the DC and the pulse I-V characteristics, suggesting that the $R_{ON}$ drop at high temperatures is primarily due to the mobility degradation instead of self-heating.

FIG. 17 shows pie-charts of the calculated turn on resistance for various lengths of the Schottky diode. In particular, the top pie-chart shows the $R_{ON}$ for length $L_{AC}$=20 μm, and the bottom pie-chart shows the $R_{ON}$ for length $L_{AC}$=95 μm. The anode region (junction fin+p-GaN termination) contributes less than 9% of the total device $R_{ON}$ for length $L_{AC}$=95 μm.

FIG. 18 shows graphs representing example reverse I-V characteristics of the Schottky diode 100 shown in FIG. 1. In particular, FIG. 18 shows a comparison of the reverse I-V characteristics of the Schottky diode 100 shown in FIG. 1 with other diodes with only junction fins (C) or only planar p-GaN termination (B) in the anode region. The Schottky diode 100 exhibits a breakdown voltage (BV) of 5205 V with a 1.4 μA/mm reverse leakage current $I_R$ at 90% BV. The diode with only planar p-GaN termination (B) exhibits a similar BV but over a tenfold higher reverse leakage current $I_R$. The diode with only NiO based junction fins exhibits a microampere range $I_R$, but at a relatively lower BV of about 2 kV. These results indicate that the Schottky diode 100 operates with the p-GaN extension sustaining the peak electric field and with the trenches and corresponding fins to lower the $I_R$.

Figure 19:
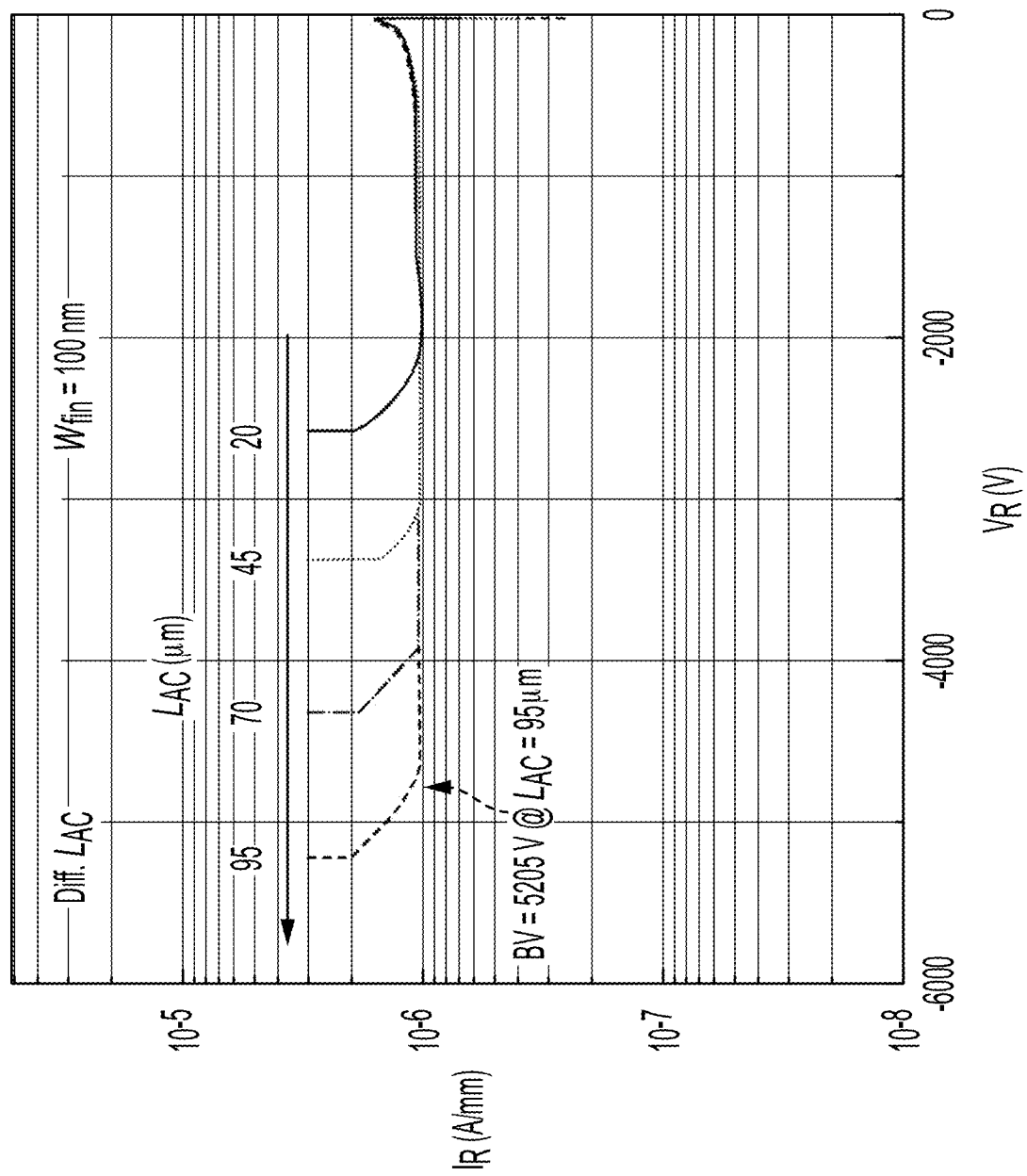
FIG. 19 shows graphs representing example reverse I-V characteristics of the Schottky diode of FIG. 1 for various device lengths.
Figure 20:
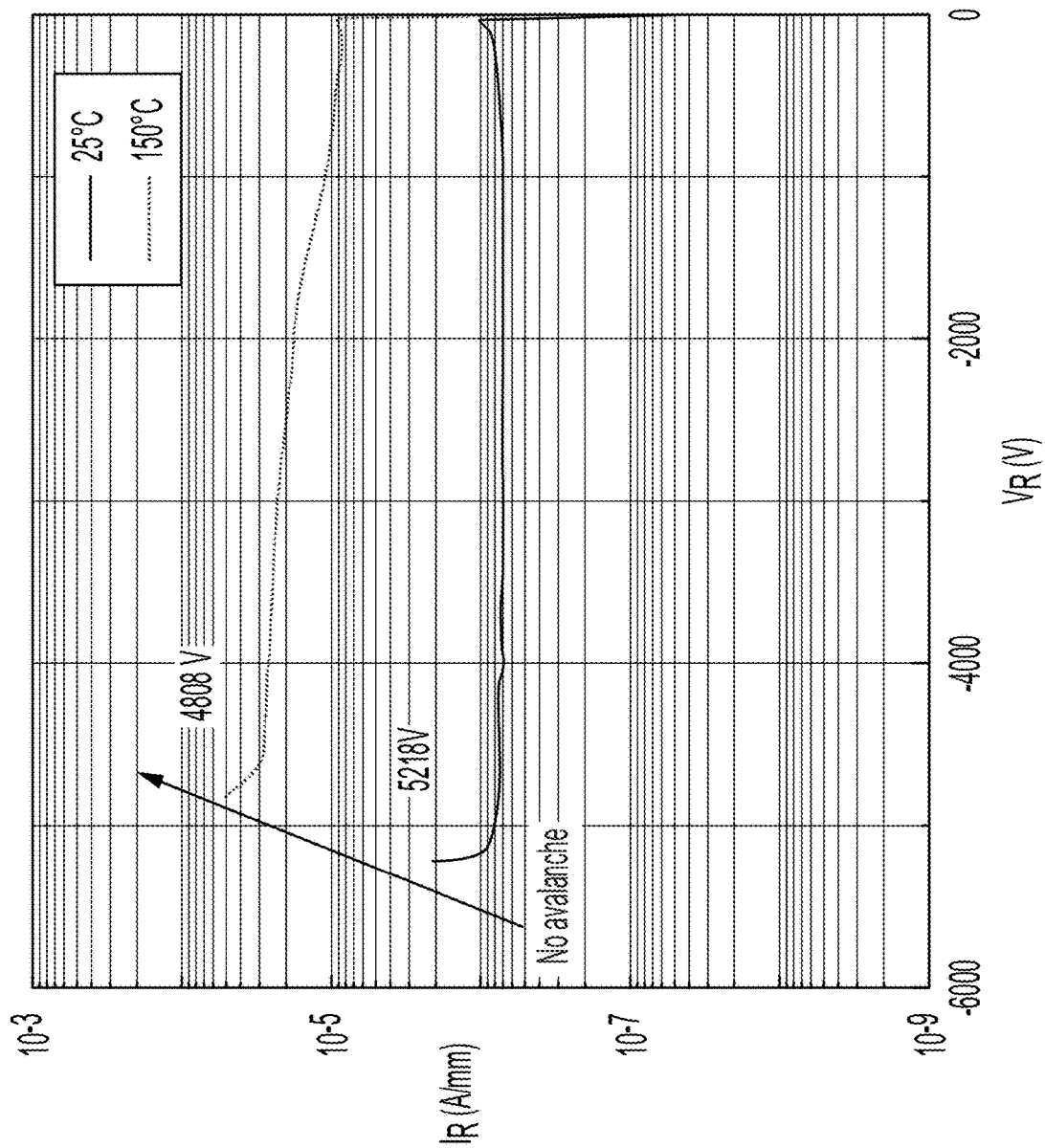
FIG. 20 shows graphs representing the reverse I-V characteristics of the Schottky diode shown in FIG. 1 for various temperatures.
Figure 21:
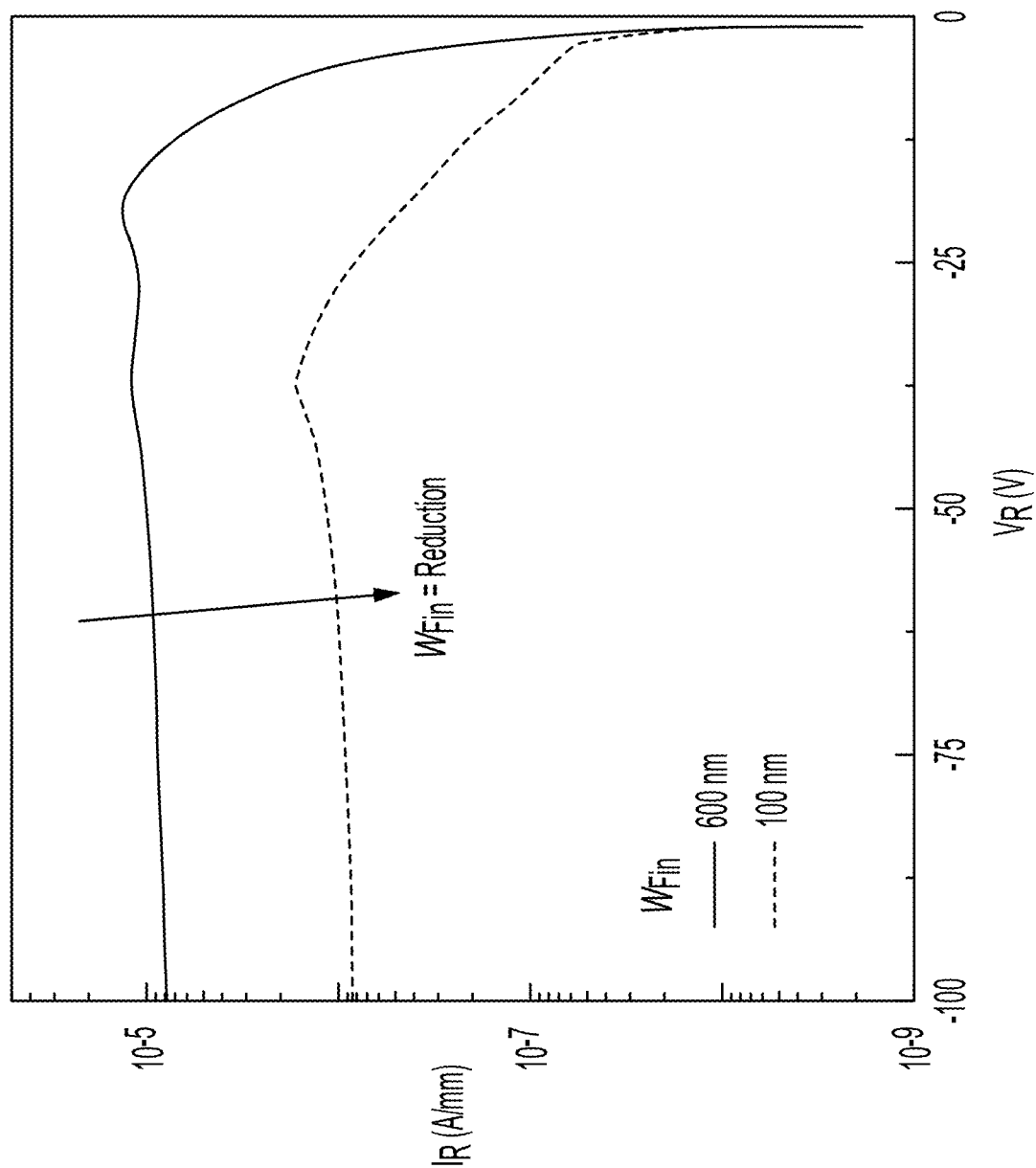
FIG. 21 shows graphs representing reverse I-V characteristics of the Schottky diode shown in FIG. 1 for various fin widths.

FIG. 19 shows graphs representing example reverse I-V characteristics of the Schottky diode of FIG. 1 for various device lengths. In particular, the I-V characteristics of the Schottky diode are plotted over $L_{AC}$ values of 20, 45, 70, and 95 μm. The graph shows that the magnitude of the breakdown voltage BV increases with an increase in the device length. Specifically, the BV increases from about 2.5 kV to about 5.2 kV. The reverse leakage current $I_R$ is at least 50-fold lower than some traditional Schottky barrier diodes (e.g., see reference [8]). FIG. 20 shows graphs representing the reverse I-V characteristics of the Schottky diode shown in FIG. 1 for various temperatures. The graph shows an approximately twenty-fold increase in the reverse leakage current $I_R$ with an increase in the temperature from 25° C. to 150° C. Thus, the dependence on temperature variations is relatively smaller than in some traditional 3.3 kV SiC junction barrier diodes. At 150° C., the breakdown voltage BV can slightly drop to 4.8 kV, implying a trap-mediated breakdown process. FIG. 21 shows graphs representing reverse I-V characteristics of the Schottky diode shown in FIG. 1 for various fin widths. The reverse leakage current $I_R$ decreases with a decrease in the width ($W_{fin}$) of the fins 110.

Figure 22:
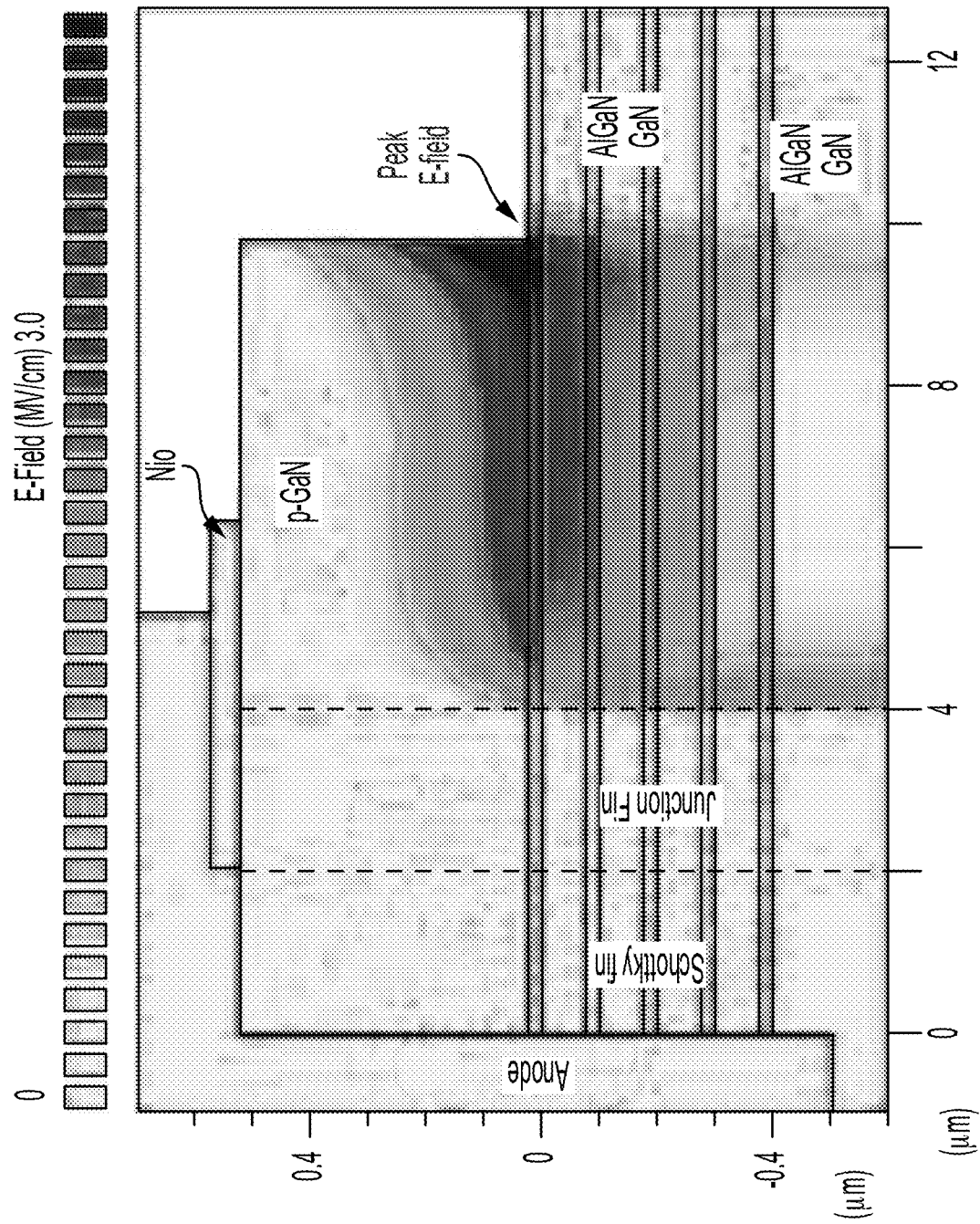
FIG. 22 illustrates a simulated distribution of an electric field in the anode region of the Schottky diode 100 shown in FIG. 1.
Figure 23:
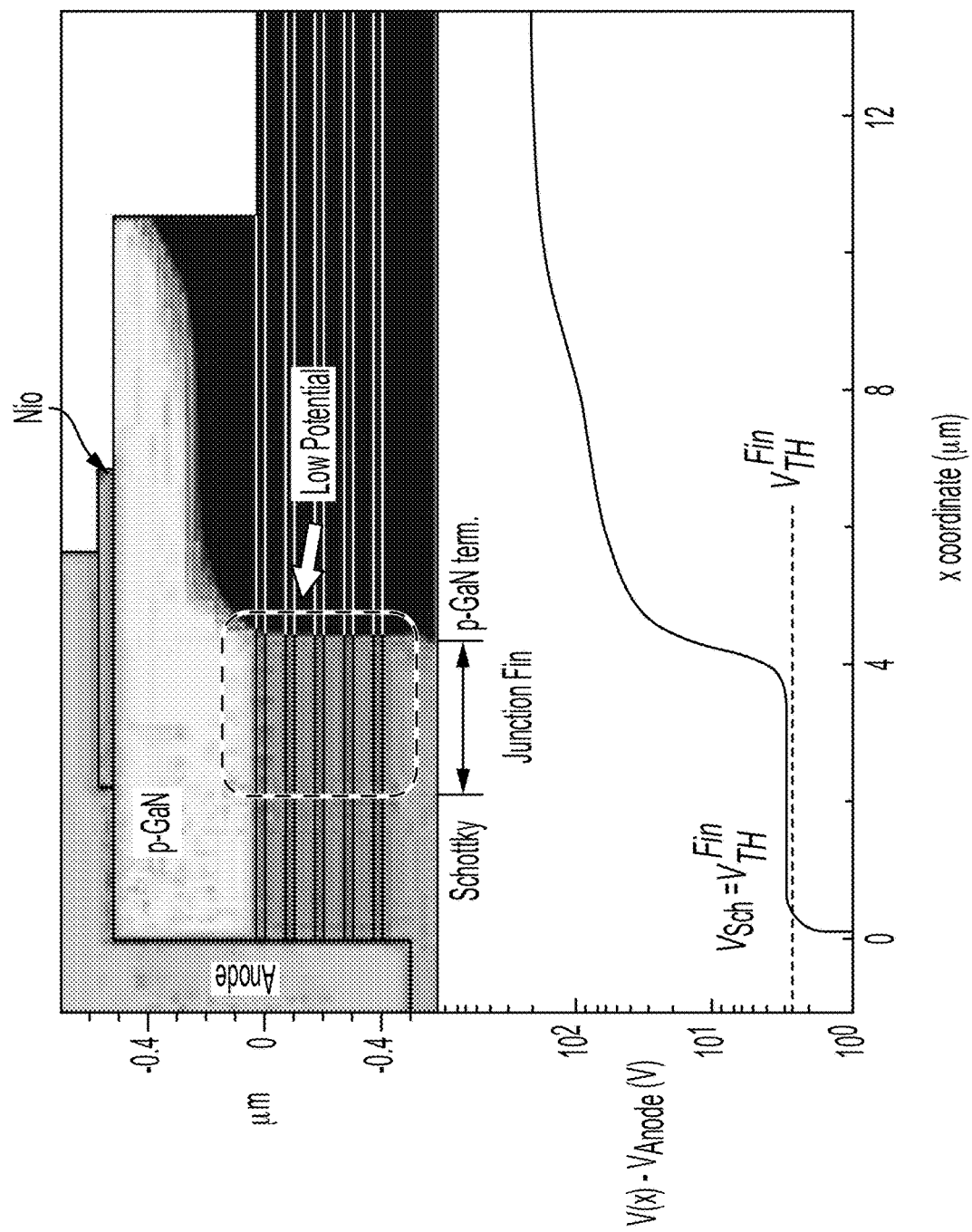
FIG. 23 illustrates a simulated potential distribution in the anode region of the Schottky diode 100 shown in FIG. 1.

FIG. 22 illustrates a simulated distribution of an electric field in the anode region of the Schottky diode 100 shown in FIG. 1. In particular, the simulated distribution is generated for the Schottky diode 100 shown in FIG. 1 with $L_{AC}$=8 μm at $V_R$ of 200 V. The peak electric field is located at the edge of the extension of the p-GaN material 112 over the semiconductor material 108. As a result, the peak electric field is positioned away from the Schottky fin that is formed by the contact between the anode material and the semiconductor material 108. FIG. 23 illustrates a simulated potential distribution in the anode region of the Schottky diode 100 shown in FIG. 1. The potential distribution is simulated for the Schottky diode 100 with $L_{AC}$=8 μm at $V_R$ of 200 V, showing that the voltage drop in the Schottky junction ($V_{Sch}$) saturates at the $V_{TH}$ of the junction fin gated HEMT.

Figure 24:
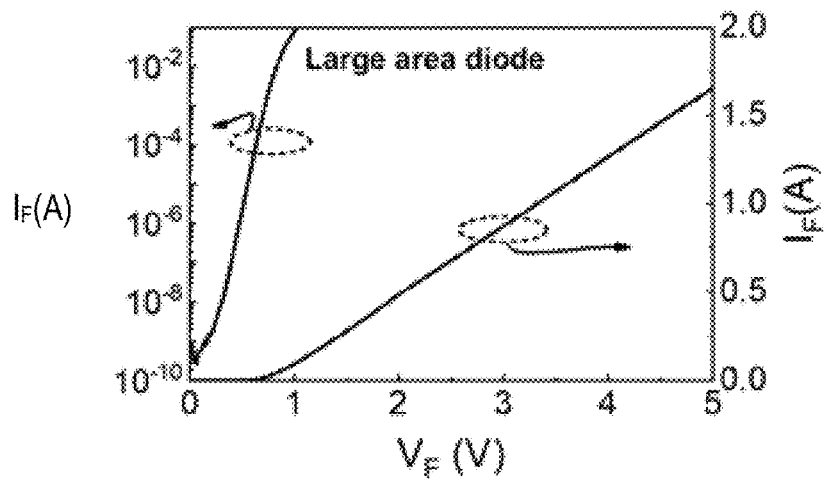
FIGS. 24-26 show graphs representing the I-V and C-V characteristics of the Schottky diode shown in FIG. 1 with a large area.
Figure 25:
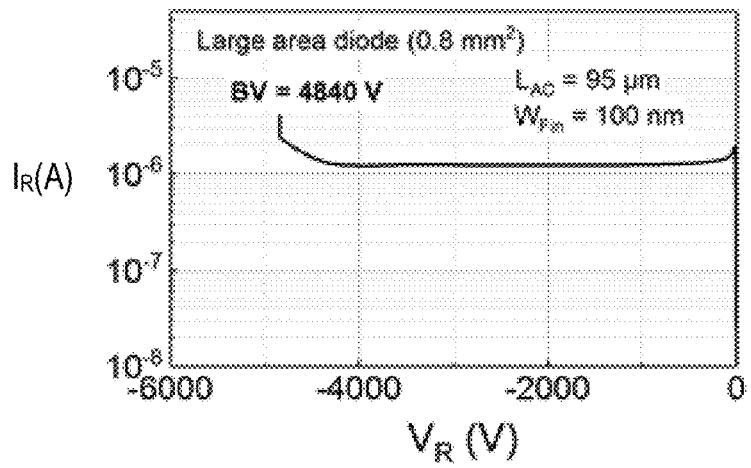
Figure 26:
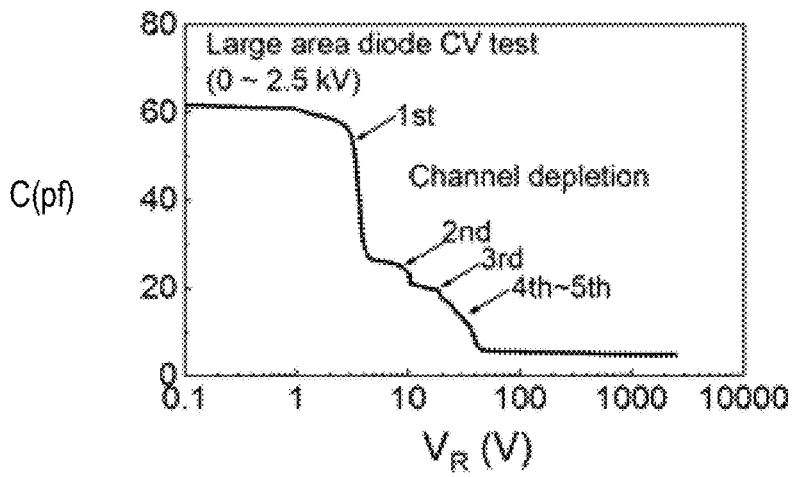

FIGS. 24-26 show graphs representing the I-V and C-V characteristics of the Schottky diode shown in FIG. 1 with a large area. In particular, the large area corresponds to an area of about 0.8 mm². The graphs exhibit a forward current over 1.5 A, an on/off ratio of $10^9$, a value of $V_{ON}$ of about 0.66 V, and a breakdown voltage (BV) of about 4.8 kV. The value of $R_{ON}$ (about 17 mΩ·cm²) is slightly larger than that of a small-area Schottky diode 100 due to the lack of aluminum pads, which are often employed to reduce the contact resistance in the device package. The C-V curves show the successive depletion of the two-dimensional carrier channels 128. A total charge of about 13 nC can be derived from the C-V integral over 2500 V.

Table 1 below shows a comparison of selected device metrics values between the Schottky diodes discussed herein and traditional known high voltage Schottky diodes. The Baliga's figure of merit (FOM) ($BV^2/R_{ON}$) of the Schottky diode discussed herein is amount the highest in all multi-kilovolt unipolar Schottky power rectifiers. The Schottky diode discussed herein also exhibits a lower $V_{ON}$ and a lower $R_{ON}$ than SiC based Schottky barrier diodes and junction barrier diodes with comparable reverse voltages. Furthermore, the Schottky diode of FIG. 1, which in some examples can be implemented with a GaN on sapphire substrate can have at least two to three-fold lower wafer cost compared to similar sized SiC wavers (see, for example, reference [13]). Thus, the Schottky diodes discussed herein exhibit superior performance.

TABLE 1

| Device | Maker | BV (V) | $R_{on}$ (mΩ·cm²) | $V_{on}$ (V) | $I_F$ @ 3 V (A/cm²) | $I_R$ @ 90% BV (A/cm²) | $I_F/I_R$ |
|---|---|---|---|---|---|---|---|
| Schottky diode shown in FIG. 1 | Discussed herein | 4840 | 17 | 0.66 | 100 | $1.2 \times 10^{-4}$ | $8 \times 10^5$ |
| SiC SBD | IISB [14] | 4670 | 47 | 1 | 45 | $4 \times 10^{-4}$ | $1.2 \times 10^5$ |
| SiC SBD | CNM, | 3500 | 37 | 1 | 45 | $8 \times 10^{-4}$ | $5.6 \times 10^4$ |
| SiC JBS Diode | ABB, Infineon [2] | 3700 | 26 | 1 | 95 | $3.5 \times 10^{-5}$ | $2.7 \times 10^6$ |
| SiC Charge-Balance SBD | GE [13] | 3300 | 4.3 | 1 | 350 | N. A. | N. A. |

References: All cited references, patent or literature, are incorporated by reference in their entirety. The examples disclosed herein are illustrative and not limiting in nature. Details disclosed with respect to the methods described herein included in one example or embodiment may be applied to other examples and embodiments. Any aspect of the present disclosure that has been described herein may be disclaimed, i.e., exclude from the claimed subject matter whether by proviso or otherwise.

[1] A. Q. Huang, Proc. IEEE, vol. 105, no. 11, pp. 2019, 2017.

[2] J. Millán et al., in International Semiconductor Conference, 2015, pp. 11.
[3] H. Amano et al., J. Phys. Appl. Phys., vol. 51, no. 16, p. 163001, 2018.
[4] H. Ohta et al., IEEE Electron Device Lett., vol. 41, no. 1, pp. 123, 2020.
[5] A. Colón et al., Solid-State Electron., vol. 151, pp. 47, 2019.
[6] H. Ishida et al., in IEDM Tech. Dig., 2008.
[7] A. P. Zhang et al., Appl. Phys. Lett., vol. 78, no. 6, pp. 823, 2001.
[8] M. Xiao et al., IEEE Electron Device Lett., vol. 41, no. 8, pp. 1177, 2020.
[9] J. Ma et al., in IEDM Tech. Dig., 2019, pp. 4.1.1.
[10] J. Ma et al., IEEE Electron Device Lett., vol. 40, no. 2, pp. 275, 2019.
[11] B. Wang et al., Appl. Phys. Lett., vol. 115, no. 26, p. 263503, 2019.
[12] Y. Zhang et al., J. Phys. Appl. Phys., vol. 51, no. 27, p. 273001, 2018.
[13] R. Ghandi et al., Proc. 31st ISPSD, 2019, pp. 179.
[14] J. Schoeck et al., Proc. MSF, 2017, vol. 897, pp. 427.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A diode, comprising:
   a semiconductor region having at least one two-dimensional carrier channel of a first conductivity type, the first conductivity type being one of a n-type and a p-type conductivity;
   a plurality of sidewalls exposed in the semiconductor region defining at least one trench extending through the at least one two-dimensional carrier channel;
   a material of a second conductivity type, the second conductivity type being the other of the n-type and the p-type conductivity, in contact with the plurality of sidewalls and in contact with the at least one two-dimensional carrier channel;
   an anode material in contact with at least a portion of the semiconductor region and in contact with at least a portion of the material of the second conductivity type; and
   a cathode material in contact with the at least one two-dimensional carrier channel.

2. The diode of claim 1, wherein the anode material additionally covers at least a portion of the plurality of sidewalls and forms a Schottky contact with the at least one two-dimensional carrier channel.

3. The diode of claim 2, wherein the material of the second conductivity type is disposed between the anode material and the portion of the plurality of sidewalls.

4. The diode of claim 3, wherein the anode material is in contact with at least one sidewall of the plurality of sidewalls and is in contact with the material of the second conductivity type that is in turn in contact with another sidewall of the plurality of sidewalls.

5. The diode of claim 1, wherein the anode material additionally covers at least a portion of a bottom surface of the at least one trench, and wherein the material of the second conductivity type is disposed between the anode material and the portion of the bottom surface.

6. The diode of claim 1, wherein a portion of the material of the second conductivity type forms a lateral depletion region in conjunction with the semiconductor region, a portion of the anode forms a Schottky contact with the portion of the semiconductor region, and wherein the lateral depletion region is positioned between the Schottky contact and the cathode.

7. The diode of claim 1, wherein the plurality of sidewalls define the at least one trench as a cavity in the semiconductor region.

8. The diode of claim 7, wherein the material of the second conductivity type completely fills the cavity in the semiconductor region.

9. The diode of claim 7, wherein the material of the second conductivity type has a top surface in the cavity, and wherein the top surface of the material of the second conductivity type is coplanar with a top surface of the semiconductor region.

10. The diode of claim 8, wherein the material of the second conductivity type additionally covers at least a portion of a top surface of the semiconductor region, and wherein the anode material is disposed over the material of the second conductivity type over the portion of the top surface of the semiconductor region.

11. The diode of claim 1, wherein the material of the second conductivity type includes a first material of the second conductivity type and a second material of the second conductivity type, wherein the first material of the second conductivity type covers a portion of a top surface of the semiconductor region, and wherein the second material of the second conductivity type is disposed on the plurality of sidewalls.

12. The diode of claim 9, wherein the anode material covers portions of the plurality of sidewalls not covered by the second material of the second conductivity type.

13. The diode of claim 1, wherein the plurality of sidewalls define a plurality of fins interspaced with a plurality of the at least one trench, wherein the anode material forms a Schottky contact with the at least one two-dimensional carrier channels exposed on at least one sidewall outside of the plurality of the at least one trench.

14. The diode of claim 1, wherein the anode material additionally covers at least a portion of the plurality of sidewalls and forms a Schottky contact with at least one two-dimensional carrier channel, and wherein under reverse bias voltage conditions on the diode, a peak of a resulting electric field within the diode is positioned away from a position of the Schottky contact.

15. The diode of claim 1, wherein the semiconductor region includes at least one III-nitride material.

16. The diode of claim 1, further comprising: a substrate layer; and
   a buffer layer disposed over the substate layer, wherein the semiconductor region having the at least one two-dimensional carrier channel of a first conductivity type is disposed over the buffer layer.

17. The diode of claim 1, wherein a reverse breakdown voltage of the diode is about 5 kV and a reverse leakage current is less than or equal to 1.4 µA/mm.

18. The diode of claim 1, wherein the at least at least one two-dimensional carrier channel is formed at an interface of an aluminum gallium nitride material and a gallium nitride material.

19. The diode of claim 1, wherein the plurality of sidewalls define a plurality of fins interspaced with a plurality of the at least one trench, wherein the anode material forms a sidewall outside of the plurality of the at least one trench, and wherein a width of at least one fin of the plurality of fins is between 100 nm and 1000 nm.

20. The diode of claim 19, wherein a spacing between the plurality of fins is between 100 nm and 1000 nm.

\* \* \* \* \*